United States Patent
Li et al.

(10) Patent No.: US 8,429,577 B2
(45) Date of Patent: Apr. 23, 2013

(54) PREDICTIVE MODELING OF INTERCONNECT MODULES FOR ADVANCED ON-CHIP INTERCONNECT TECHNOLOGY

(75) Inventors: Xia Li, San Diego, CA (US); Wei Zhao, Tempe, AZ (US); Yu Cao, Tempe, AZ (US); Shiqun Gu, San Diego, CA (US); Seung H. Kang, San Diego, CA (US); Matthew Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 230 days.

(21) Appl. No.: 12/474,297

(22) Filed: May 29, 2009

(65) Prior Publication Data

US 2009/0327983 A1 Dec. 31, 2009

Related U.S. Application Data

(60) Provisional application No. 61/076,011, filed on Jun. 26, 2008, provisional application No. 61/078,964, filed on Jul. 8, 2008, provisional application No. 61/151,634, filed on Feb. 11, 2009.

(51) Int. Cl.
G06F 9/455 (2006.01)
G06F 17/50 (2006.01)

(52) U.S. Cl.
USPC .................. 716/106; 716/110; 716/111

(58) Field of Classification Search ............. 716/106
See application file for complete search history.

(56) References Cited

U.S. PATENT DOCUMENTS

| | | | |
|---|---|---|---|
| 7,124,378 B2 | 10/2006 | Matsuzawa | |
| 7,308,662 B2* | 12/2007 | Goren et al. | 716/106 |
| 7,831,941 B2 | 11/2010 | Chidambarrao et al. | |
| 2006/0015276 A1 | 1/2006 | Goren | |
| 2007/0044063 A1 | 2/2007 | Faour | |
| 2007/0109003 A1 | 5/2007 | Shi | |
| 2008/0313586 A1 | 12/2008 | Takaki | |
| 2009/0173516 A1 | 7/2009 | Burke et al. | |
| 2009/0199139 A1* | 8/2009 | White et al. | 716/4 |
| 2010/0057411 A1 | 3/2010 | Li et al. | |

FOREIGN PATENT DOCUMENTS

WO 9901900 1/1999

OTHER PUBLICATIONS

Banerjee, Kaustav; Souri, Shukri; Kapur, Pawan; Saraswat, Krishna; "3-D ICs: A Novel Chip Design for Improving Deep-Submicrometer Interconnect Performance and Systems-on-Chip Integration," May 2001, IEEE.*
Bansal, Aditya; Paul, Bipul; Roy, Kaushik; "An Analytical Fringe Capacitance Model for Interconnects Using Conformal Mapping," Dec. 2006, IEEE.*

(Continued)

*Primary Examiner* — Vuthe Siek
*Assistant Examiner* — Eric Lee
(74) *Attorney, Agent, or Firm* — Michelle Gallardo

(57) ABSTRACT

A computer program product estimates performance of an interconnect structure of a semiconductor integrated circuit (IC). The program product includes code executing on a computer to calculate at least one electrical characteristic of the interconnect structure based on input data accounting for multiple layers of the interconnect structure. The electrical characteristics can be capacitance, resistance, and/or inductance. The capacitance may be based upon multiple components, including a fringe capacitance component, a terminal capacitance component, and a coupling capacitance component.

20 Claims, 13 Drawing Sheets

OTHER PUBLICATIONS

Cheng, Y.L; Wang, Y.L; Chen, H.C.; "Extraction of effective dielectric constants and the effect of process damage of low-k dielectrics for advanced interconnects," Sep. 26, 2006, Elsevier.*
Anonymous; "New Parasitic Capacitance Modeling in Hipex-C," Mar. 2005, The Simulation Standard.*
Qi, Xiaoning; Wang, Gaofeng; Yu Zhiping; Dutton, Robert; "On-Chip Inductance Modeling and RLC Extraction of VLSI Interconnects for Circuit Simulation," May 2000, IEEE.*
Arora N D: "Modeling and characterization of copper interconnects for SoC design" Simulation of Semiconductor Processes and Devices, 2003. SISPAD 2003. International Conference on Sep. 3-5, 2003, Piscataway, NJ, USA,IEEE, Sep. 3, 2003, pp. 1-6, XP010658811 ISBN: 978-0-7803-7826-1 the whole document.
Invitation to Pay Additional Fees—PCT/US2009/047668, International Search Authority—European Patent Office—Oct. 30, 2009.
Kaustav Banerjee et al: "3-D ICs: A Novel Chip Design for Improving Deep-Submicrometer Interconnect Performance and Systems-on-Chip Integration" Proceedings of the IEEE, IEEE. New York, US, vol. 89, No. 5, May 1, 2001, XP011044501 ISSN: 0018-9219 the whole document.
Kong J-T: "CAD for Nanometer Silicon Design Challenges and Success" IEEE Transactions on Very Large Scale Integration (VLSI) Systems, IEEE Service Center, Piscataway, NJ, US, vol. 12, No. 11, Nov. 1, 2004, pp. 1132-1147, XP011121258 ISSN: 1063-8210 the whole document.
Youssef Travaly et al: "On a More Accurate Assessment of Scaled Copper/Low-k Interconnects Performance" IEEE Transactions on Semiconductor Manufacturing, IEEE Service Center, Piscataway, NJ, US, vol. 20, No. 3, 1.
Aug. 8, 2007, pp. 333-340, XP011189526 ISSN: 0894-6507 the whole document.
International Search Report—PCT/US2009/047668, International Search Authority—European Patent Office—Feb. 9, 2010.
Written Opinion—PCT/ US2009/047668, Internationsal Search Authority—European Patent Office Feb. 9, 2010.
Kaustav Banerjee et al: "3-D ICs: A Novel Chip Design for Improving Deep-Submicrometer Interconnect Performance and Systems-on-Chip Integration" Proceedings of the IEEE, IEEE. New York, US, vol. 89, No. 5, May 1, 2001, XP01104450; ISSN: 0018-9219.
Arora N D: "Modeling and characterization . . . -_•_. of copper interconnects for SoC design" Simulation of Semiconductor Processes and Devices, 2003. SISPAD 2003. International Conference on Sep. 3-5, 2003, Piscataway, NJ, USA,IEEE, Sep. 3, 2003, pp. 1-6, XP010658811; ISBN: 978-0-7803-7826-1.
Kong J-T: "CAD for Nanometer Silicon Design Challenges and Success" IEEE Transactions on Very Large Scale Integration (VLSI) Systems, IEEE Service Center, Piscataway, NJ, US, vol. 12, No. 11, Nov. 1, 2004, pp. 1132-1147, XP011121258; ISSN: 1063-8210.
Youssef Travaly et al: "On a More Accurate Assessment of Scaled Copper/Low-k Interconnects Performance" IEEE Transactions on Semiconductor Manufacturing, IEEE Service Center, Piscataway, NJ, US, vol. 20, No. 3, Aug. 1, 2007, pp. 333-340, XP011189526; ISSN: 0894-6507.
Liang Choo Hsia et al: "BEOL Advance Interconnect Technology Overview and Challenges" VLSI Technology, Systems and Applications, 2008. VLSI-TSA 2008. International Symposium on, IEEE, Piscataway, NJ, USA, Apr. 21, 2008, pp. 28-29, XP031258800; ISBN: 978-1-4244-1614-1.
Gosset et al: "Advanced Cu interconnects using air gaps" Microelectronic Engineering, Elsevier Publishers BV., Amsterdam, NL, vol. 82, No. 3-4, Dec. 1, 2005, pp. 321-332, XP005183023; ISSN: 0167-9317.
Anonymous: "New Parasitic Capacitance Modeling in Hipex-C" Simulation Standard vol. 15, No. 3, Mar. 1, 2005, pp. 4-6, XP002564617; Retrieved from the Internet: URL:http://www.si 1vaco.fr/tech_li b/si mulat i onstandard/2005/mar/a2/mar05_a2.pdf>[retrieved on Dec. 4, 2009] p. 5-p. 6.
Aditya, Bipul, and Kaushik, "An Analytical Fringe Capacitance Mode for Interconnects Using Conformal Mapping," 0278-0070, IEEE Transactions on Computer-Aided Design of Integrated Circuits and Systems, vol. 25, No. 12, Dec. 2006, p. 2765-2774.
Chang, "Analytical IC Metal-Line Capacitance Formulas," IEEE Transactions on Microwave Theory and Techniques. Sep. 1976, p. 608-611.
Elmasry, "Capacitance Calculations in MOSFET VLSI," 0193-8576/82/0100-0006 1981, IEEE Elctron Device Letters, vol. EDL-3, No. 1, Jan. 1982, p. 6-7.
Sakurai, "Closed-Form Expression for Interconnection Delay, Coupling, and Crosstalk in VLSI's," 0018-9383/93 1993 IEEE, IEEE Transactions on Electron Devices, vol. 40, No. 1, Jan. 1993, p. 118-124.
Wong, Lee, Ma, and Chao, "An Empirical Three-Dimensional Crossover Capacitance Model for Multilevel Interconnect VLSI Circuits," 0894-6507/00 2000 IEEE, IEEE Transactions on Semiconductor Manufacturing, vol. 13, No. 2, May 2000, p. 219-227.
Nabors and White, "FastCap: A Multipole Accelerated 3-D Capacitance Extraction Program," 0278-0070/91/1100-1447 1991 IEEE, IEEE Transactions on Computer-Aided Design, vol. 10, No. 11, Nov. 1991, p. 1447-1459.
International Technology Roadmap for Semiconductors 2007 Edition Interconnect, 67 pages.
Barke, "Line-to-Ground Capacitance Calculations for VLSI: A Comparison," 0278-0070/88/0200-0295 1988 IEEE, IEEE Transactions on Computer-Aided Design, vol. 7, No. 2, Feb. 1988, p. 295-298.
Wong, Lee and Ma, "Modeling of Interconnect Capacitance, Delay and Crosstalk in VLSI," 0894-6507/00 2000 IEEE, IEEE Transactions on Semidonductor Manufacturing, vol. 13, No. 1, Feb. 2000, p. 108-111.
Zhao and Cao, "New Generation of Predictive Technology Model for Sub-45 nm Early Design Exploration," 0018-9383 2006 IEEE, IEEE Transactions on Electron Devices, vol. 53, No. 11, Nov. 2006, p. 2816-2823.
Zhao, Li, Nowak and Cao, "Predictive Technology Modeling for 32nm Low Power Design," ISDRS 2007—http://www.ece.umd.edu/ISDRS, Dec. 12-14, 2007, College Park, MD, USA, Student Paper, Department of Electrical Engineering, Arizona State University, Tempe, USA.
Synopsys Data Sheet, "Raphael Interconnect Analysis Tool," p. 1-4, 2006.
Yuan and Trick, "A Simple Formula for the Estimation of the Capacitance of Two-Dimensional Interconnects in VLSI Ciructs," 0193-8587/82/1200-039 1982 IEEE, IEEE Electron Device Letters, vol. EDL-3, No. 12, Dec. 1982, p. 391-393.
Sakurai and Tamaru, "Simple Formulas for Two- and Three-Dimensional Capacitances," Briefs, 0018-0383/83/0200-0183 1983 IEEE, IEEE Transactions on Electron Devices, vol. ED-30, No. 2, Feb. 1983, p. 183-185.
2008 Focus ITWG Tables, 32 pages, www.itrs.net/links/2008ITRS/Update/2008Tables_FOCUS_B.xls.
Rossnagel, et. al, "Alteration of Cu conductivity in the size effect regime," Journal of Vacuum Science & Technology B: Microelectronics and Nanometer Structures, 2004, pp. 240-247.
Schindler, et. al, "Recent Advances for Nano Interconnects: Conductor Reliability and Resistivity," Conference Proceedings ULSI XVIII, 2003, pp. 13-19.

* cited by examiner

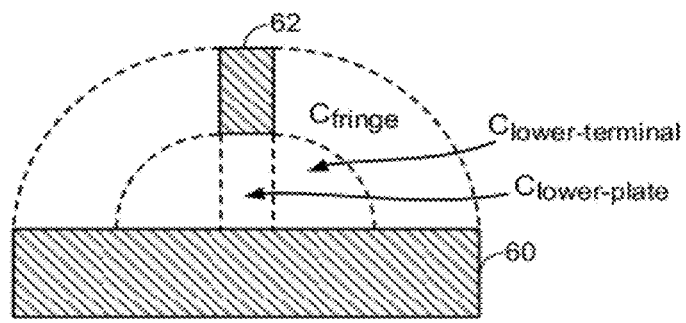
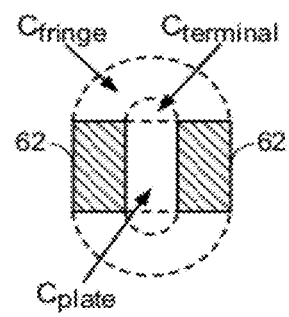
FIG. 7A  FIG. 7B
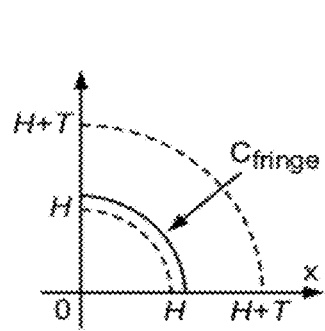
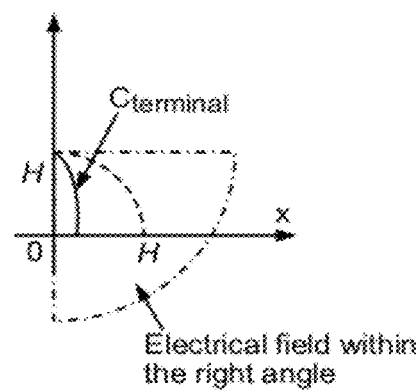
FIG. 7C  FIG. 7D

PREDICTIVE MODELING OF INTERCONNECT MODULES FOR ADVANCED ON-CHIP INTERCONNECT TECHNOLOGY

CROSS-REFERENCE TO RELATED APPLICATIONS

This application claims the benefit of U.S. Provisional Patent Application No. 61/076,011, filed Jun. 26, 2008, entitled "Predictive Modeling and Methodology of Interconnect Modules for Advanced On-Chip Interconnect Technology," U.S. Provisional Patent Application No. 61/078,964, filed Jul. 8, 2008, and U.S. Provisional Patent Application No. 61/151,634, filed Feb. 11, 2009.

TECHNICAL FIELD

The present disclosure generally relates to semiconductor technology. More specifically, the present disclosure relates to predicting electrical characteristics of semiconductor components, such as on-chip interconnect technology.

BACKGROUND

Interconnect technology has become increasingly important for designing integrated circuits (ICs). Interconnects are part of the back-end-of-the-line (BEOL) processing in multi-layered semiconductor devices. On-chip interconnects distribute clock and data signals as well as power and ground signals to various functional blocks in an IC. As the IC designs become smaller and more compact, the size, dimensions, materials, and positioning of the interconnects become increasingly significant factors in overall performance.

IC designers commonly use modeling tools to estimate the electrical performance and parasitic properties of interconnects. Modeling tools perform high-level simulations of interconnect electrical properties and behavior. However, existing interconnect modeling tools do not dynamically predict the behavior of an entire multi-level interconnect system, such as an interconnect stack. As operating frequencies and the number of interconnect layers continue to increase, predicting behavior of interconnects becomes increasingly problematic. Thus, accurate modeling of interconnect behavior has become increasingly important to the process of designing smaller and faster ICs.

Moreover, as interconnects shrink, inductance effects become increasingly significant. However, existing interconnect modeling tools are largely based on resistance-capacitance (RC) parameters.

Existing modeling tools can model the on-chip interconnects of only one technology node (e.g., 45 nm or 32 nm) at a time, because existing modeling tools commonly use actual foundry data with specific interconnect pitches and isolation layer information. If the specific interconnect pitches and material layers are changed, the back end of line (BEOL) model needs to be re-simulated. Hence, a new simulation environment must be defined for each technology node. Moreover, because the existing modeling tools use actual foundry data, they can only provide results late in the development cycle.

Further, existing modeling tools are specific to a foundry's design requirements because they use data of specific foundries. Therefore, a model from foundry A is not necessarily compatible with a model from foundry B.

For the foregoing reasons, there is a need for providing a comprehensive and accurate model for predicting behavior of scaled interconnect stack configurations in advanced technology nodes to simulate on-chip interconnect performance early in the development cycle. In addition, the model should be configurable in the sense that it can predict performance of alternate interconnect stack configurations, such as configurations from a different foundry with, for example, different materials, film stacks and/or k values.

SUMMARY

The present disclosure is directed to a computer software program that satisfies the need of providing a comprehensive and accurate model to simulate on-chip interconnect performance early in the development cycle. In accordance with one aspect of the present disclosure, the computer software program provides interconnect performance predictions in future technology generations based on a relationship between a model and existing wafer data by deriving values of the model's coefficients using the existing wafer data.

The method includes generating the model, which is provided by a set of equations defining an experimental conductive interconnect similar to the conductive interconnect in the existing wafer. The set of equations include computations of scattering effects that increase resistivity as device dimensions shrink. More importantly, the model can predict both the physical dimensions and performance of the experimental interconnect across multiple technology nodes. The set of equations includes a set of coefficients, which have derived values from the existing wafer data. The derived values can be configured as constants to allow the model to be employed constantly across multiple technology nodes. In other words, the model can receive multiple physical dimension inputs without the need of recreating the simulation environment.

The set of equations can be initialized to provide initial conditions in starting up the model. The model is validated against the resistance data and the capacitance data of the existing wafer. The validation includes an iterative process to adjust the set of coefficients to assure the model yields measurements similar to the existing wafer data. The iterative process continues until there is a close agreement between the existing wafer data and the model. The close agreement is a predetermined margin of error, which is less than five percent in one embodiment. As a result, the model can at least reproduce measurements of the existing wafer. However, the model is not only limited to simulating existing semiconductor devices, but future devices as well. Therefore, the model can provide estimations of the technology capabilities for the metal interconnect and provide an IC designer with insightful information to make realistic design choices. Of course, a computing device, such as a computer processor, a special processor, or any other device capable of executing computer instructions can implement the method.

The model is intended to provide a quick estimation of metal interconnects beyond existing nodes and provide an accurate picture of the effects on performance by shrinking devices. The model accounts for the variations in width, which greatly affect the resistance in shrinking devices. Although the model is derived from existing wafer data, the model simulates interconnects without using existing wafer data therefore not delaying the development cycle.

In one aspect, a computer program product estimates performance of a conductive interconnect structure of a semiconductor integrated circuit (IC). The computer program product is tangibly stored on a computer-readable medium and includes code executing on a computer to dynamically calculate at least one electrical characteristic of the interconnect structure based on input data that accounts for multiple layers of the interconnect structure.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is made to the following description taken in conjunction with the accompanying drawings.

FIGS. 7A and 7B are diagrams illustrating electrical field distributions among interconnect stack components.

FIGS. 7C and 7D are graphs illustrating a fringe capacitance component and a terminal capacitance component, respectively.

DETAILED DESCRIPTION

A detailed description of one or more embodiments is provided below along with accompanying figures that illustrate the principles of the embodiments. The scope of the embodiments is limited only by the claims and encompasses numerous alternatives, modifications and equivalents. Numerous specific details are set forth in the following description. These details are provided solely for the purposes of example and the embodiments may be practiced according to the claims without some or all of these specific details.

The present disclosure discusses a model that estimates on-chip interconnect characteristics in one or more technology nodes that have minimum feature sizes scaling down beyond 45 nanometers (nm), such as 28 nm and 22 nm. The term "minimum feature size" generally refers to the width of the smallest manufacturable transistor gate length that appears in an IC design. The term "technology node" generally refers to a generational age of a semiconductor device indicated by its minimum feature size.

Figure 2:
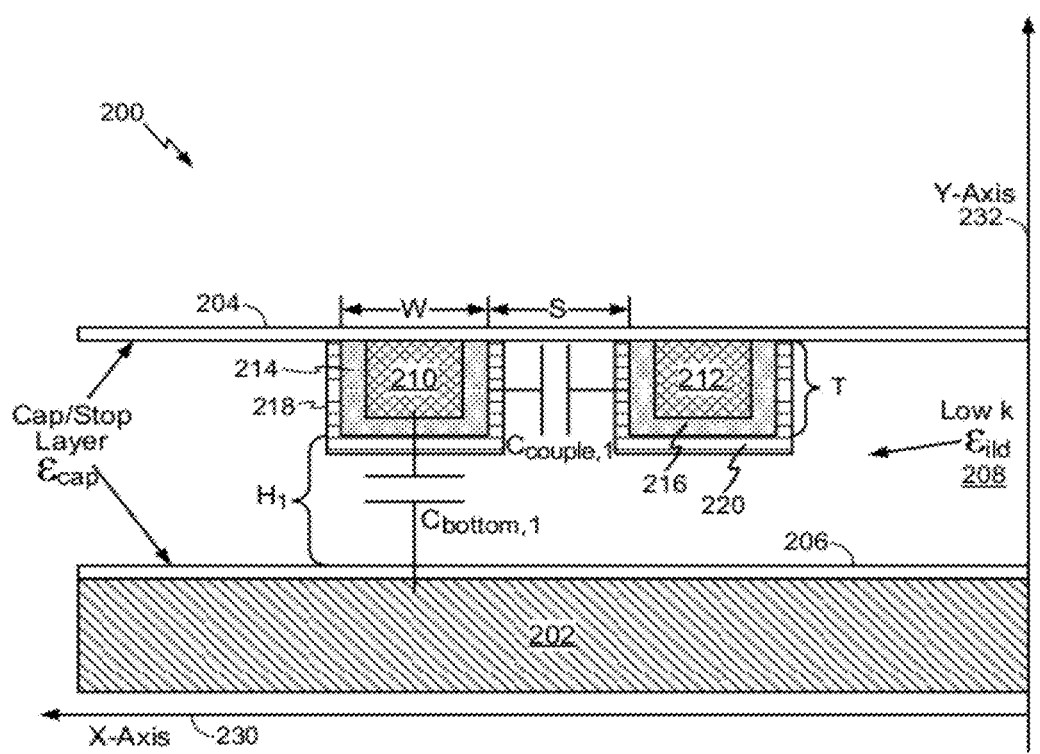
FIG. 2 is a diagram illustrating a cross-section view of an exemplary single-plate interconnect stack.
Figure 3:
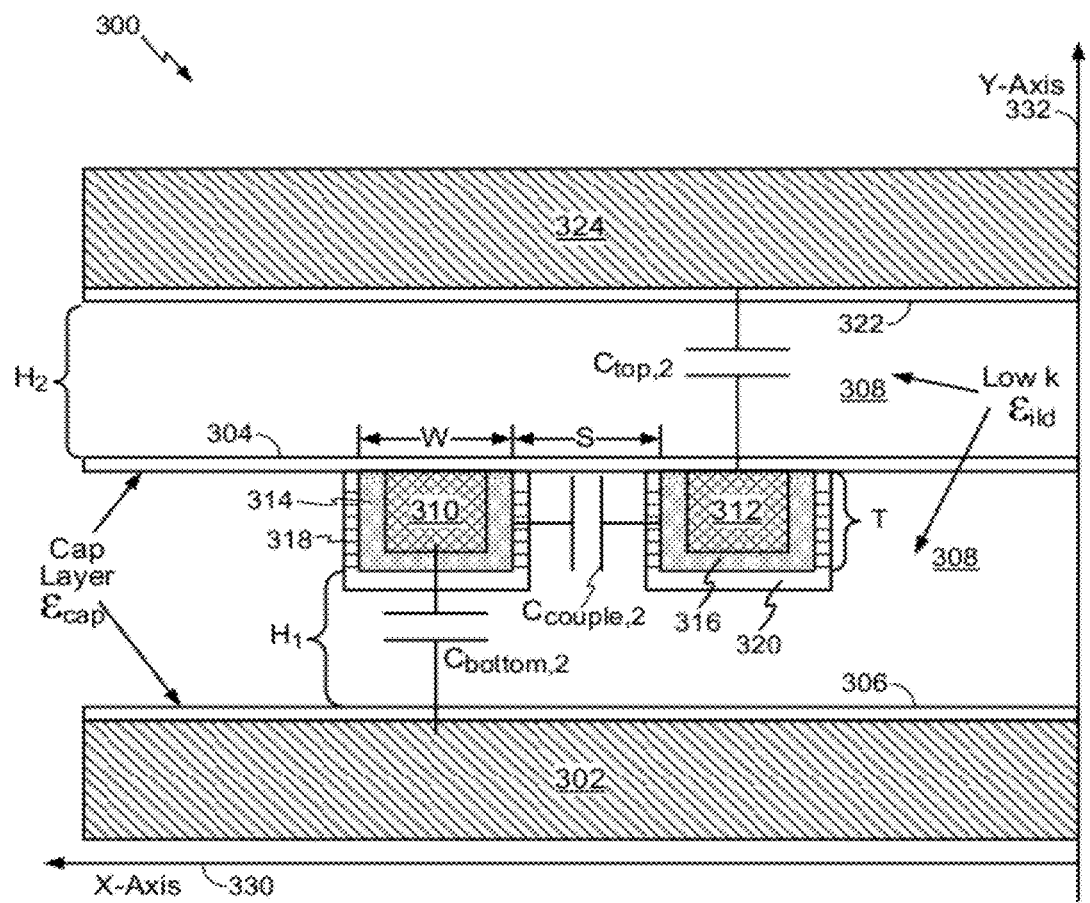
FIG. 3 is a diagram illustrating a cross-section view of an exemplary double-plate interconnect stack.
Figure 6:
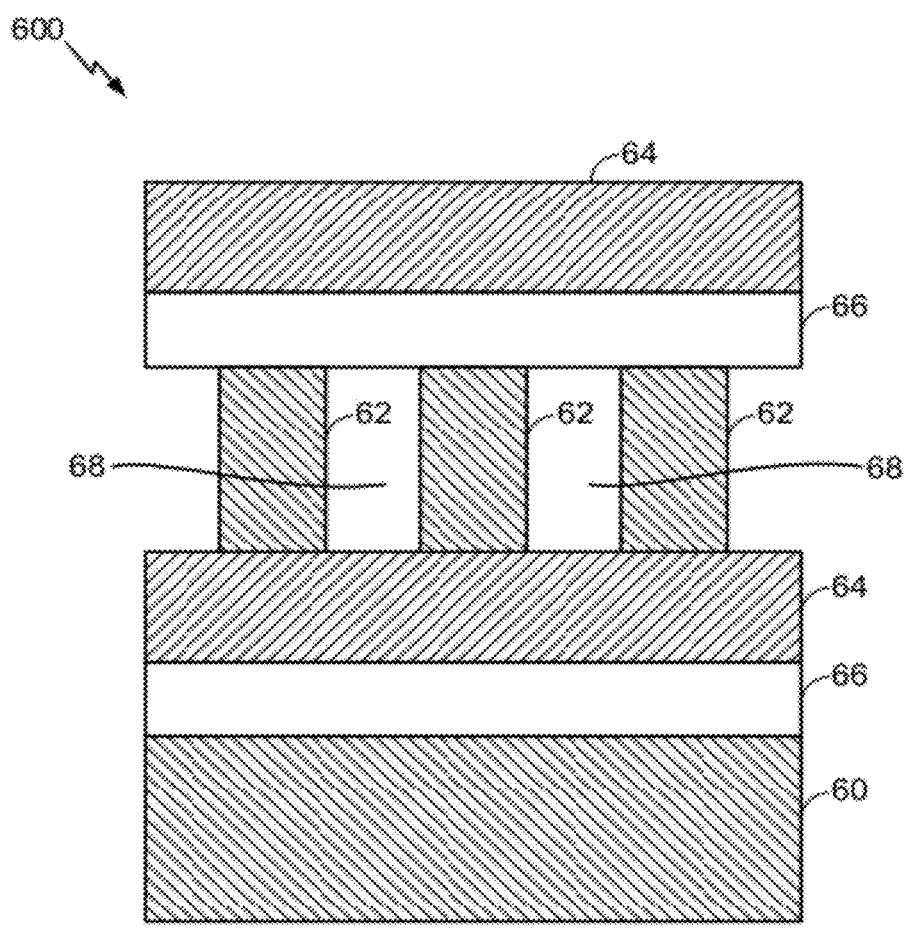
FIG. 6 is a diagram illustrating a cross-section view of an exemplary double-plate interconnect stack with air gaps and copper diffusion barriers.

For purposes of illustrating exemplary on-chip interconnects, a single-plate interconnect stack with a conductive trace engaging a bottom plate is described in FIG. 2, and a double-plate interconnect stack with a conductive trace positioned between the bottom plate and a top plate is described in FIG. 3. Additional features such as air gaps are shown in FIG. 6. As used herein, the term "interconnect stack" generally refers to an on-chip interconnect with one or more layers formed by a manufacturing process, such as a dual damascene patterning process with low-k dielectrics. The dual damascene patterning process includes damascene trench photo processing.

Figure 1:
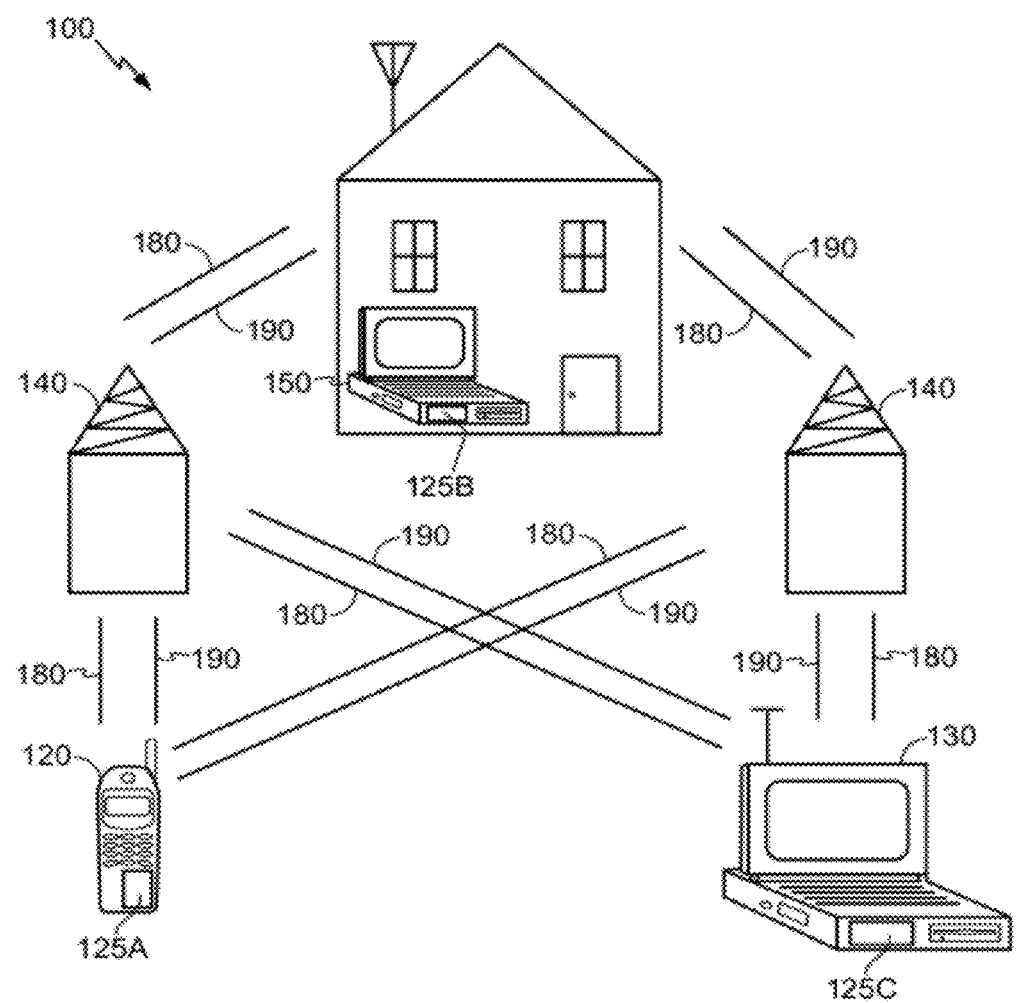
FIG. 1 is a block diagram showing an exemplary wireless communication system.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that conventional wireless communication systems may have many more remote units and base stations. Remote units 120, 130, and 150 include semiconductor devices 125A, 125B and 125C, which are embodiments of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be mobile phones, hand-held personal communication systems (PCS) units, portable data units such as personal data assistants, navigation devices (such as GPS enabled devices), set top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. Embodiments of the disclosure may be suitably employed in any device which includes active integrated circuitry.

The foregoing disclosed devices and methods are commonly designed and configured into hardware description language, such as VHDL and Verilog computer files, stored on a computer-readable media. These files are in turn provided to fabrication handlers who fabricate devices based on these files. The resulting products are semiconductor wafers that are then cut into semiconductor die and packaged. The packaged die are employed in the devices described above.

FIG. 2 is a diagram illustrating a cross-section view of an exemplary single-plate interconnect stack. The interconnect stack 200 is a single-plate structure in which a conductive trace (e.g., metal wire or interconnect) is positioned above a conductive plate.

The interconnect 200 has a width (W), height above the bottom plate ($H_1$), thickness (T), and spacing (S). Here, the interconnect 200 includes two conductive traces 210, 212. The two conductive traces 210, 212 are positioned between two cap layers ($T_s$) 204, 206. Each of the cap layers has a higher-k permittivity ($\in_{cap}$) than silicon oxide or other low-k dielectric materials, which can vary according to the semiconductor material used for the cap layers. The cap layer 206 is adjacent to a conductive plate 202 ("bottom plate") along an x-axis 230. The cap layer 204 is adjacent the traces 210, 212. The two conductive traces each have barrier conductive (e.g., metal) layers ($T_t$) 214, 216, which are liners for the conductive traces that surround the traces 210, 212 up to the cap layer 204. A low-k inter-layer or inter metal dielectric ($\in_{ild}$) 208 surrounds the two conductive traces 210, 212.

The illustrated width dimension, W, measures across the conductive trace 210 and the barrier metal layer 214 along the x-axis 230. The thickness dimension, T, measures across the entire conductive trace 210 and the barrier metal layer 214 along a y-axis 232. The space, S, present between the neighboring conductive traces measures from the conductive trace 210 at the outer edge of the barrier metal layer 214 to the conductive trace 212 at the outer edge of the barrier metal layer 216 along the x-axis 230. The height dimension, H, measures from the outer edge of the barrier layer 214 to the bottom plate 202 along the y-axis 232. Although these dimensions are described with respect to one or the other of the traces 210, 212, because the traces have substantially identical geometry, the dimensions correspond to either trace 210, 212.

A very thin layer around each trace 210, 212 is damaged during manufacturing, e.g., during a damascene process. This damage layer would have an increased dielectric constant, and could be separately accounted for to increase accuracy of the model. In FIG. 2, the damage layers ($T_d$) 218, 220 surround the barrier layers 214, 216 up to the cap layer 204. Further, the damage layers have their own permittivity ($\in_d$), which is greater than that of the inter-layer dielectric ($\in_{ild}$).

Electrical characteristics of the interconnect stack 200, such as the parasitic capacitance between the conductive traces 210, 212, can be modeled comprehensively. A coupling capacitance ($C_{couple,\,1}$) indicates capacitance between the two conductive traces 210, 212. A bottom capacitance ($C_{bottom,\,1}$) indicates capacitance between one of the conductive traces and the bottom plate 202. These capacitances are evaluated from the surface of each trace 210, 212. In particular embodiments, there may be more, fewer, or different features other than those shown in FIG. 2.

FIG. 3 is a diagram illustrating a cross-section view of an exemplary double-plate interconnect stack. The interconnect stack 300 is a double-plate structure in which conductive traces 310, 312 are positioned between two conductive plates 302, 324.

Here, the interconnect 300 includes two conductive traces 310, 312 also having barrier metal layers ($T_t$) 314, 316, and damage layers ($T_d$) 318, 320, 322. In addition, the two conductive traces 310 and 312 are positioned between the two cap layers ($T_s$) 304 and 306. The cap layer 306 is adjacent to the bottom plate 302. The cap layer 304 is adjacent the traces 310, 212. An additional damage layer 322 is adjacent to the top plate 324. Each of the cap layers 304, 306 has a higher-k permittivity ($\in_{cap}$) than silicon oxide or other low-k dielectric materials. A low-k inter-layer dielectric ($\in_{ild}$) 308 surrounds the two conductive traces, and is also disposed between the cap layers 304 and the damage layer 322.

The width (W) dimension measures across the entire conductive trace 310 and the barrier layer 314 along an x-axis 330. The thickness (T) dimension measures across the conductive trace 310 and the barrier layer 314 along a y-axis 332. The space (S) dimension present between neighboring conductive traces measures from the conductive trace 310 at the outer edge of the barrier metal layer 314 to the conductive trace 312 at the outer edge of the barrier metal layer 316 along the x-axis 330. A first height ($H_1$) dimension measures from the outer edge of the barrier metal layer 314 to the bottom plate 302 along the y-axis 332. A second height ($H_2$) dimension measures from the conductive trace 310 or 312 to the top plate 324.

Electrical characteristics, such as the parasitic capacitance, may be modeled to extract the behavior of the interconnect stack 300. A coupling capacitance ($C_{couple,\,2}$) indicates capacitance between the two conductive traces 310, 312. A bottom capacitance ($C_{bottom,\,2}$) indicates capacitance between either of the conductive traces 310, 312 and the bottom plate 302. A top capacitance ($C_{top,\,2}$) indicates capacitance between either conductive trace 310, 312, and a top plate 324. In particular embodiments, there may be more, fewer, or different features other than those shown in FIG. 3.

Figure 4:
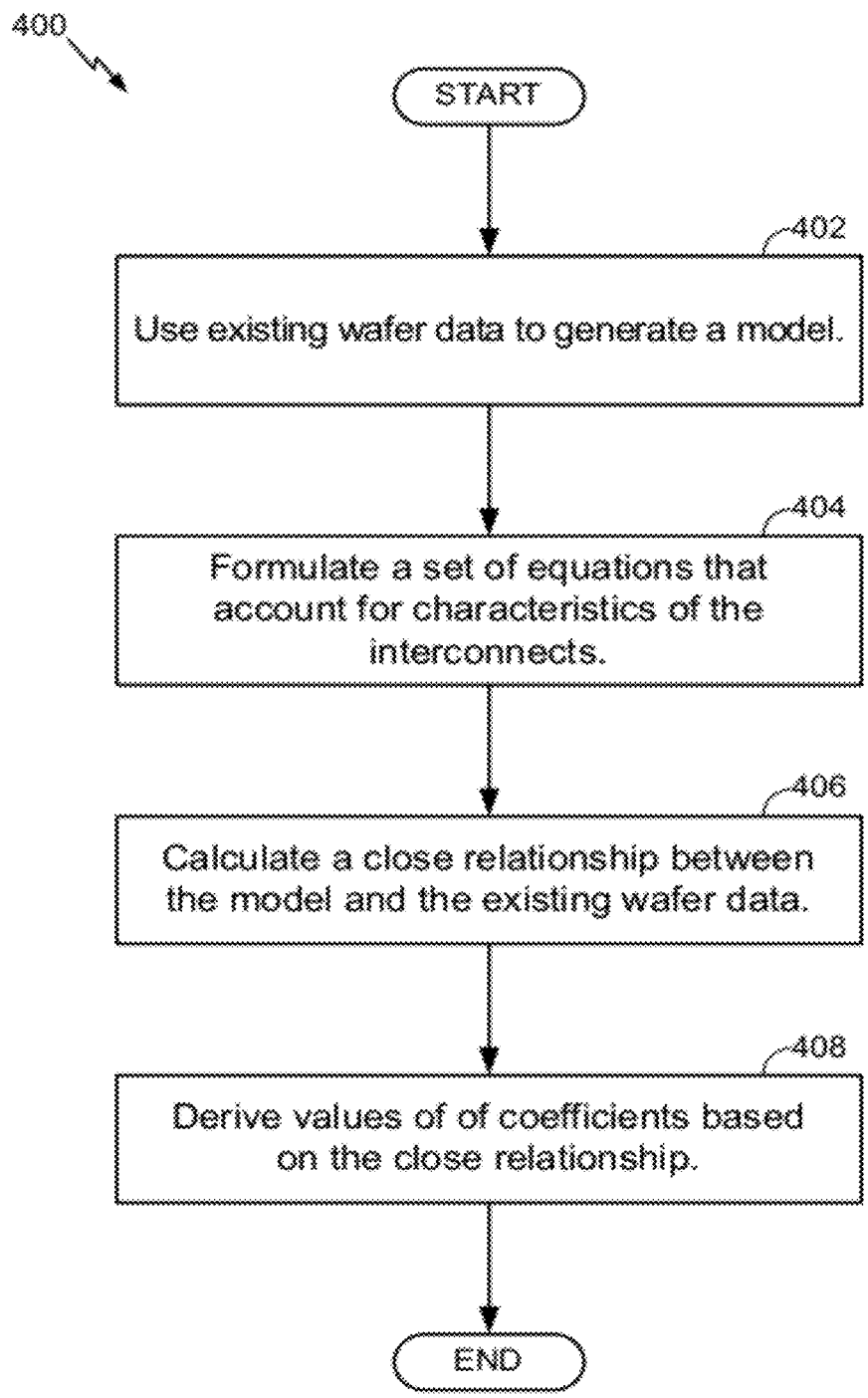
FIG. 4 is a block diagram illustrating an exemplary flow for providing a model that simulates an on-chip interconnect across multiple technology nodes.

FIG. 4 is a block diagram illustrating an exemplary flow for providing a model that simulates an on-chip interconnect across multiple technology nodes. FIG. 4 summarizes a flow 400 with a method of producing a model to estimate performance in interconnects. The method begins with using existing wafer data to generate a model (402). The method also includes formulating a set of equations that account for characteristics of the interconnects, in which the set of equations further include a set of coefficients (404). In addition, a close relationship is calculated between the model and the existing wafer data (406). Further, values of the set of coefficients are derived based on the close relationship (408).

The existing wafer data of block 402 can be physical and electrical data such as dimensions, resistance data and capacitance data. The dimensions can be provided by a foundry that manufactures the existing wafer. Alternatively, the dimensions can be measured from the existing wafer using conventional test instrumentation. In one embodiment, the dimensions describe the physical arrangement of the high-speed interconnects. In another embodiment, a simulation tool simulates extracts resistance and capacitance data based on the dimensions. Further, the existing wafer data can be used to calibrate the model for accuracy.

It is noted that in this description, the term "simulation" differs from "model." The "simulation" is based on existing tools, whereas the "model" is an aspect of the present disclosure.

The set of equations of block 404 include equations that model the physical makeup of the interconnect structure. In addition, the set of equations models variations in the sizing and shaping of the interconnect structure caused by scattering effects. Scattering effects increase the effective resistivity of shrinking interconnects, thus significantly increasing the interconnect delay (e.g., propagation delay). Conventional modeling tools ignore the scattering effect parameter.

At block 406, results from the model (e.g., projected results) are compared against the existing wafer data (e.g., expected results) to determine a close relationship. Moreover, block 406 can further include calculating the set of coefficients using the resistance and capacitance data generated by the third party tool. In one embodiment, the results are compared individually, such as on a dimension by dimension basis. In another embodiment, the data is compared as a whole.

At block 408, the set of equations has a set of coefficients, which have values derived from the existing wafer data. The set of coefficients undergo a calibration process until the model yields results that are in close agreement with the existing wafer data. A selected margin of error is provided so the model yields results with high accuracy. In one embodiment, the margin of error is less than five percent. The set of coefficients can be normalized before being calibrated. As a result, the model provides an accurate estimation of performance data for interconnects projected to be designed in nodes beyond existing nodes. One set of equations has a coefficient that relates the resistivity of a specific material to the variations in width of the experimental interconnect.

Further, the flow 400 can include providing the set of coefficients with fixed values so the model produces estimates of the experimental interconnect constantly across multiple technology nodes. Another set of equations can be formulated so the model estimates inductance within the experimental interconnect. In some embodiments, the flow 400 and the above-described elements may be varied and are not limited to the methods, functions, configurations, examples, or steps provided.

Figure 5:
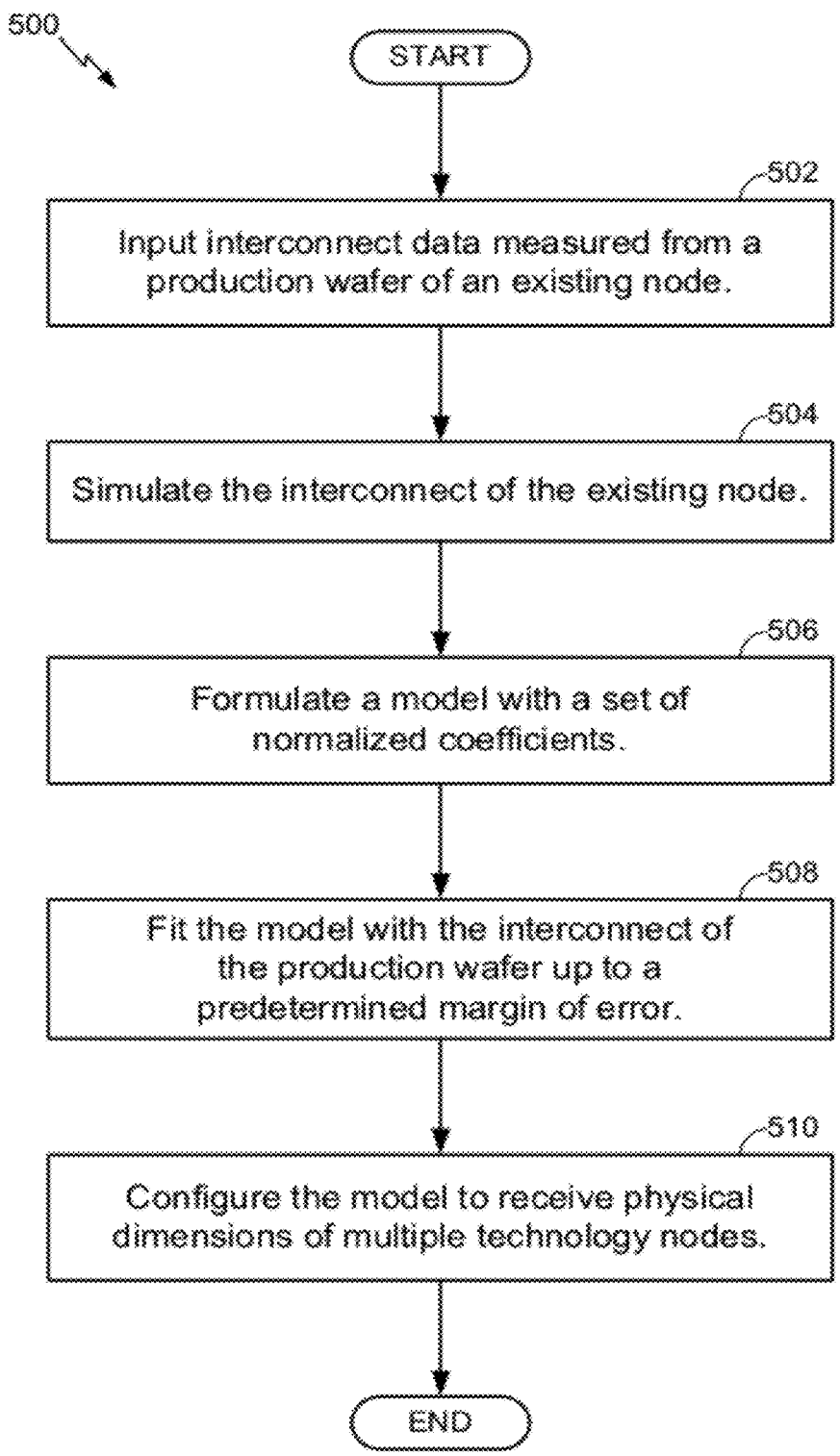
FIG. 5 is a block diagram illustrating another exemplary flow for providing a model that simulates an on-chip interconnect across multiple technology nodes.

FIG. 5 is a block diagram illustrating an exemplary flow for calibrating a model that simulates an on-chip interconnect across multiple technology nodes. The model includes capacitance components and resistance components, each model component having coefficients that need to be initially set. By comparing the model results with simulated results obtained from previous analysis tools, the coefficient values are calculated and the model calibrated.

Because the model is configured for modeling experimental interconnects in nodes beyond existing nodes (i.e., future nodes), the process that defines the model is validated by known (or existing) data. Experimental measurements can be made throughout the process to further calibrate (or adjust) the coefficients of the model.

The process begins at block 502 by providing dimensions and characteristics of an interconnect measured from a production wafer of an existing node. Block 502 also includes identifying features of the interconnect, such as materials, and various layers to be considered (e.g., damage layer, cap layer, etc.). FIGS. 2 and 3 illustrate exemplary dimensions and features that are measured from the production wafer. In some instances, information about the dimensions of existing wafers can be provided by a semiconductor authority, such as the International Technology Roadmap for Semiconductors (ITRS), which publishes projections of future technology capabilities in semiconductor designs.

At block 504, the interconnect of the existing node is simulated to extract electrical information, such as resistance data and capacitance data. A third party interconnect analyzer, such as the RAPHAEL simulation tool by SYNOPSYS, Inc. of Mountain View, Calif., simulates interconnects based on existing wafer data. The RAPHAEL simulation tool provides a tabulated result of the electrical characteristics of the interconnect. The electrical characteristics, such as the resistance data and capacitance data, are gathered to derive values of the coefficients, which are later discussed with reference to block 506. Of course, there may be alternatives to the RAPHAEL simulation tool that provide similar results of the electrical characteristics which can be obtained at block 504.

It is noted that in this description, the term "simulation" differs from "model." The "simulation" is based on existing tools, whereas the "model" is an aspect of the present disclosure.

At block 506 a model with a set of normalized coefficients that can be modified is formulated. The model includes components for calculating resistance (R), inductance (L), and capacitance (C) for the interconnect, based upon multiple layers of the interconnect. Computing the resistance-inductance-capacitance (RLC) product provides a more comprehensive description of the interconnect behavior than the conventional resistance-capacitance (RC) product. More importantly, by accounting for the different layers separately, the results will be more accurate. As feature sizes decrease, measuring variations in width within the interconnects becomes increasingly important to overcome the deficiencies in measuring performance by conventional modeling tools.

Interconnects, such as those based on the dual damascene structure, have one or more components that are either ignored or inaccurately modeled by conventional modeling tools. For example, the liner thickness and resistance, the damage layer thickness and k value and the cap layer thickness and k value have been ignored to date. To provide a more accurate model which also considers scattering effects of shrinking interconnects, the model should consider these additional components.

The model is based on a set of equations that receive as input physical characteristics measured from the production wafer, as well as electrical data calculated by the simulation. For example, inputs include but are not limited to the thickness (T) and the width (W) of the conductive trace, the distance between the conductive trace and a neighboring plate (H), the spacing between multiple conductive traces (S), and the thickness of the cap, damage, and barrier layers ($T_s$, $T_d$, and $T_t$). The set of equations also receives as input the dielectric properties of components surrounding the conductive trace such as the permittivity constants of the interlayer dielectric or inter metal dielectric, cap and damage layers ($\in_{ild}$, $\in_{cap}$, and $\in_d$). A dielectric constant of a vacuum, $\in_o$ is also input.

The model predicts resistance and capacitance using separate resistance equations and capacitance equations. Each equation has a set of normalized coefficients (e.g., $a_n$, $b_n$, $c_n$) that can be adjusted (or calibrated) to fit the existing wafer data into close agreement. The capacitance equations will be discussed first.

A first set of equations calculates the capacitance using the features and layers of the interconnect, as shown in FIGS. 2 and 3. In one embodiment, both the fringe capacitance and coupling capacitance are considered. Equation (1) defines a total capacitance for the double-plate interconnect stack shown in FIG. 3.

$$C_{total,1} = C_{top,1} + C_{bottom,1} + C_{couple,1} \quad (1)$$

For the double plate interconnect stack, the total capacitance considers the conductive trace capacitance with fringe flux to the top plate and bottom plate and coupling capacitance. Sub-equation $C_{bottom,1}$ is the capacitance of the conductive trace with fringe flux to the bottom plate; sub-equation $C_{couple,1}$ is the coupling capacitance of the conductive trace to neighboring conductive traces; sub-equation $C_{top,1}$ is the top fringe capacitance.

Equation (2) defines sub-equation $C_{top,1}$ as follows:

$$C_{top,1} = \varepsilon_o \varepsilon_{ild} \left[ \frac{W}{h_{21}} + a_1 \left( \frac{T}{T + b_1 h_2} \right)^{c_1} \cdot \left( \frac{S}{S + b_2 h_2} \right)^{c_2} \cdot \left( \frac{S}{S + b_3 h_1} \right)^{c_3} \right] \quad (2)$$

The top fringe capacitance, $C_{top,1}$, is a function of the dielectric constants $\in_{ild}$, $\in_o$, width (W), spacing (S), and thickness (T) of the interconnect, and further includes normalized coefficients $a_1$, $b_{1-3}$, and $c_{1-3}$. In addition, equation (2) is a function of $h_1$, $h_2$, and $h_{21}$, which respectively are the effective bottom dielectric thickness if considering the bottom cap layer 306, the effective top dielectric thickness if considering the top cap layer 304, and the effective top dielectric thickness if considering the top cap layer 304 and damage layer 322. The values $h_1$, $h_2$, and $h_{21}$ are discussed further with respect to equations (9a), (9b) and (10b).

Equation (3) defines sub-equation $C_{bottom,1}$.

$$C_{bottom,1} = \varepsilon_o \varepsilon_{ild}\left[\frac{W}{h_{21}} + a_2\left(\frac{T}{T+b_1 h_1}\right)^{c_1} \cdot \left(\frac{S}{S+b_2 h_1}\right)^{c_2} \cdot \left(\frac{S}{S+b_3 h_2}\right)^{c_3}\right] \quad (3)$$

The bottom fringe capacitance, $C_{bottom,1}$, is a function of the dielectric constants $\varepsilon_{ild}$, $\varepsilon_o$ width (W), spacing (S), and thickness (T) of the interconnect, and further includes normalized coefficients $a_2$, $b_{1-3}$, and $c_{1-3}$. In addition, equation (3) is a function of $h_1$, $h_2$, and $h_{11}$. The value $h_{11}$ is the effective bottom dielectric thickness if considering the bottom cap layer 306, and damage layer 318. The values $h_1$, $h_2$, and $h_{11}$ are discussed further with respect to equations (9a), (9b) and (10a).

Equation (4) defines sub-equation $C_{couple,1}$ as follows:

$$C_{couple,1} = \varepsilon_o \varepsilon_{ild}\left[a_3\left(\frac{T}{s_1} + a_4 \frac{T_{s2}}{s_2} e^{-\frac{T_{s2}}{T}}\right)e^{\left(-\frac{2s_1}{s_1+b_4 h_1} - \frac{2s_1}{s_1+b_4 h_2}\right)} + \right.$$
$$\left. a_5\left(\frac{W}{W+b_5 S}\right)^{c_4} \cdot \left(\left(\frac{h_1}{h_1+b_6 S}\right)^{c_5} + \left(\frac{h_2}{h_2+b_6 S}\right)^{c_5}\right) \cdot e^{\left(-\frac{2S}{S+3(h_1-h_2)}\right)}\right] \quad (4)$$

The coupling capacitance $C_{couple,1}$, is a function of the dielectric constants $\varepsilon_{ild}$, $\varepsilon_o$ width (W), spacing (S), and thickness (T) of the interconnect, and further includes normalized coefficients $a_{3-5}$, $b_{4-6}$, and $C_{4-5}$. In addition, the coupling capacitance is a function of $T_{s2}$, $s_1$, $s_2$, $h_1$, and $h_2$. The values $h_1$ and $h_2$ have been discussed above. $T_{s2}$ is the thickness of the top cap layer 304. The values $s_1$, $s_2$ are effective space widths if considering the damage layer 318 and 320 and the top cap layer 304, respectively. The values $s_1$ and $s_2$ are discussed further with respect to equations (8a), (8b).

To characterize the total capacitance for the single-plate interconnect stack of FIG. 2, coupling and fringe capacitances are considered. Equation (5) defines the total capacitance of the single-plate interconnect stack as follows:

$$C_{total,2} = C_{bottom,2} + 2C_{couple,2} \quad (5)$$

As shown, $C_{total,2}$ is the total capacitance of a conductive trace. $C_{bottom,2}$ is the capacitance of the conductive trace with fringe flux to the bottom plate. $C_{couple,2}$ is the coupling capacitance of the conductive trace to neighboring conductive traces.

Equation (6) defines sub-equation $C_{bottom,2}$ as follows:

$$C_{bottom,2} = \varepsilon_o \varepsilon_{ild}\left[\frac{W}{h_{11}} + a_7\left(\frac{S}{S+b_7 h_1}\right)^{c_7} + a_8\left(\frac{S}{S+b_8 h_1}\right)^{c_8} \cdot \left(\frac{T}{T+b_9 h_1}\right)^{c_9}\right] \quad (6)$$

The fringe capacitance, $C_{bottom,2}$, is a function of the dielectric constants $\varepsilon_{ild}$, $\varepsilon_o$ width (W), spacing (S), and height (T), and further includes normalized coefficients $a_{7-8}$, $b_{7-9}$, and $C_{7-9}$. In addition, the fringe capacitance is a function of $h_1$ and $h_{11}$, which are discussed further with respect to equations (9a), (9b) and (10b).

Equation (7) defines sub-equation $C_{couple,2}$ as follows:

$$C_{couple,2} = \varepsilon_o \varepsilon_{ild}\left[a_9\left(\frac{T}{s_1} + a_{10}\frac{T_{s2}}{s_2}e^{-\frac{b_{10}T_{s2}}{T}}\right)\left(\frac{h_1}{h_1+b_{11}S_1}\right)^{c_{10}} + \right.$$
$$\left. a_{11}\left(\frac{W}{W+b_{12}S}\right)^{c_{11}} + a_{12}\left(\frac{W}{W+b_{13}S}\right)^{c_{12}} \cdot \left(\frac{h_1}{h_1+b_{14}S}\right)^{c_{13}}\right] \quad (7)$$

The coupling capacitance, $C_{couple,2}$, is a function of the dielectric constants $\varepsilon_{ild}$, $\varepsilon_o$ width (W), spacing (S), and height (T), and further includes normalized coefficients $a_{9-12}$, $b_{10-14}$, and $c_{10-13}$. In addition, the coupling capacitance is a function of $T_{s2}$, $s_1$, $s_2$, and $h_1$, which are discussed further with respect to Equations (8a), (8b), and (9a).

Equations (8a) through (10b) define the variables, $s_1$, $s_2$, $h_1$, $h_2$, $h_{11}$, $h_{21}$, which are as follows:

$$s_1 = S - 2\left(1 - \frac{\varepsilon_{ild}}{\varepsilon_d}\right)T_d \quad (8a)$$

$$s_2 = \frac{\varepsilon_{ild}}{\varepsilon_{cap}}S \quad (8b)$$

$$h_1 = H_1 + \frac{\varepsilon_{ild}}{\varepsilon_{cap}}T_{s1} \quad (9a)$$

$$h_2 = H_2 + \frac{\varepsilon_{ild}}{\varepsilon_{cap}}T_{s2} \quad (9b)$$

$$h_{11} = h_1 - \left(1 - \frac{\varepsilon_{ild}}{\varepsilon_d}\right)T_d \quad (10a)$$

$$h_{21} = h_2 - \left(1 - \frac{\varepsilon_{ild}}{\varepsilon_d}\right)T_d \quad (10b)$$

As illustrated, $h_1$ is the effective bottom dielectric thickness if considering the bottom cap layer (e.g., cap layer 306), and $h_2$ is the effective top dielectric thickness if considering the top cap layer (e.g., cap layer 304). In addition, $h_{11}$, is the effective bottom dielectric thickness if considering the bottom cap layer (e.g., cap layer 306) and the damage layer (e.g., damage layer 318 or 320), and $h_{21}$ is the effective top dielectric thickness if considering the top cap layer (e.g., cap layer 304) and the damage layer (e.g., damage layer 322). Further, $s_1$ is the effective space width if considering the damage layer (e.g., damage layer 318 and 320), and $s_2$ is the effective space width if considering the top cap layer (e.g., cap layer 304). The value $T_d$ is the thickness of the damage layer.

To characterize the resistance in each interconnect stack, a resistivity model is provided. The resistivity model accounts for the electron scatter effect by separately considering individual layer resistances based on the layer material, such as copper or tungsten, etc. As noted previously, conductive materials such as copper are affected by structure irregularities (e.g., grain and edge roughness) as their dimensions shrink causing the resistance in the material to increase sharply. Scattering effects are based upon grain size and edge roughness of the interconnect. As interconnects continue to shrink, the scattering effect has an increasing effect on resistivity. Thus, a model that accounts for the scatter effect is more accurate when evaluating future technology nodes.

The model can be calibrated with resistance data for typical conditions. For example, the resistance data may include a distribution of resistance values under normal operating conditions, such as nominal voltages (e.g., 1 V to 5 V) and ambient temperatures (e.g., 25° C. or higher). Alternatively, the model can receive resistance data for atypical operating conditions. For example, a combination of high voltages and low temperatures describe a best-case environment to provide over performing results, or a combination of low voltages and high temperatures describe a worst-case environment to provide underperforming results.

The overall resistance of the interconnect stack, R, is defined by equation (11)

$$R = \frac{R_1 \cdot R_2}{R_1 + R_2} \quad (11)$$

where the inner layer (e.g., interconnect 310, 312) resistivity is defined as R1 and the outer layer (e.g., barrier layer 314, 316) resistivity is defined as R2.

The inner layer resistivity $R_1$ is defined by equation (12)

$$R_1 = \frac{\rho_1 \cdot L}{(W - 2T_t) \cdot (T - T_t)} \quad (12)$$

where the length, width, and thickness of the trace (L), (W), (T), respectively, and the barrier layer thickness (Tt) are considered. Also the feature size resistivity ρ1 of the inner layer material is considered.

The outer layer resistivity $R_2$ is defined by equation (13)

$$R_2 = \frac{\rho_2 \cdot L}{(W \cdot T - (W - 2T_t) \cdot (T - T_t))} \quad (13)$$

where the length, width, and thickness of the trace (L), (W), (T), respectively, and the barrier layer thickness (Tt) are considered. Also the feature size resistivity ρ2 of the outer layer material is considered.

The feature size resistivity value $\rho_1$ (and similarly $\rho_2$) is calculated based upon equation (14)

$$\rho_1 = \rho_{10}\left(1 + \frac{d_1}{W}\right) \quad (14)$$

where d1 is a normalized coefficient which relates the resistivity with the variations in width caused by scattering effects of the specific material, W is the width of the trace, and $\rho_{10}$ is a bulk resistivity of the material.

The bulk resistivity, $\rho_{10}$, is a constant multiplicative factor that relates the resistivity to the type of material used, and can be looked up from known tables or foundry data. The value $d_1$ differs based upon the material.

In another embodiment, inductance is also calculated. Equation (15) defines the interconnect inductance, where $\mu_0$ is a property constant (e.g., $4\pi \times 10^{-7}$ H/m). Equation (15) is a function of length (L), width (W), and thickness (T), and is as follows:

$$L_s = \frac{\mu_0 \cdot L}{2\pi}\left[\ln\left(\frac{2L}{W+T}\right) + \frac{1}{2} + \frac{0.22(W+T)}{L}\right] \quad (15)$$

Equation (16) defines the mutual inductance between neighboring conductive traces as shown in FIG. 2 or 3. Equation (16) is a function of length (L), the constant $\mu_0$, and distance (d), which is a center-to-center distance between two conductive traces. Equation (16) is as follows:

$$M = \frac{\mu_0 \cdot L}{2\pi}\left[\ln\left(\frac{2L}{d}\right) - 1 + \frac{d}{L}\right] \quad (16)$$

The above equations are not limited to the arrangements shown, as there may be other arrangements to compute the aforementioned characteristics.

The process at block 508 includes fitting the model to a predetermined margin of error. The fitting provides a close relationship between the model and either the existing wafer data or data obtained from running a simulation by setting the coefficient values appropriately. As part of the fitting process at block 508, the set of normalized coefficients is modified so the model is in close agreement with the existing wafer data (or simulated results). In one embodiment, the predetermined margin of error is less than ten percent.

After the fitting process, the set of coefficients become constant multiplicative factors. As a result, the model can accept multiple physical dimension inputs that describe other different sized experimental interconnects in nodes beyond existing nodes.

If interconnect stacks have different sizing requirements, processes or materials (for example from a different foundry), the coefficient values should be reset based upon the different requirements. Thus, the model may have to be modified or recreated for input from a different foundry. For instance where data from a different foundry is used, although the coefficient values are recalculated; the underlying model itself remains the same.

The model can calculate one or more data points of performance values. In particular embodiments, the data points may be visually presented, such as with plots, tables, matrices, charts, or other types of visually presented processed data. The data points can present trends in design and performance for experimental interconnects in technology nodes projected for development. Although the model is derived from existing wafer data, delays in modeling proposed interconnect designs or interconnect technology is eliminated. The interconnect impact becomes increasingly important, especially for technology nodes of 32 nm, 22 nm and beyond. Moreover, the model can enable statistical study of interconnects by accepting random skew input, which becomes increasingly valuable as dimensions decrease due to increasing influence of random variations.

In another embodiment, the capacitance is predicted based upon a physical model that accounts for electrical field fringe and shielding, charge sharing, and contemporary structural features, such as air gaps and copper diffusion barriers.

As seen in FIG. 6, an interconnect stack 600 with a conductive plate or trace 60 can have the traditional metal (AlCu, or Cu, etc) technology as a bottom plate. A metal interconnect 62 is a middle metal trace. A low-κ inter layer dielectric (ILD) or inter metal dielectric (IMD) 64 helps reduce parasitic capacitance. In this case, a cap layer 66 is provided to prevent the rapid diffusion of copper through the ILDs 64. This cap layer 66 usually has a higher dielectric constant than that of the ILD 64 and thus, increases the capacitance. As the ILD thickness keeps decreasing in CMOS scaling, the impact of the cap layer 66 becomes more pronounced because cap layer 66 scales more slowly. This cap layer 66 is similar to the cap layers 204, 206 of FIG. 2.

To minimize wire capacitance, especially the coupling capacitance between neighboring wires, recent process development focuses on new dielectric materials with even lower-κ values. For instance, air gaps 68 are expected to be integrated into the BEOL structure. The overall capacitance is affected by the air gap, and is accounted for in the next embodiment, as explained below.

In this embodiment, the capacitance between a plate or trace 60 and an interconnect 62 is simply referred to as $C_{bottom}$ (if a top plate exists, the capacitance between the interconnect 62 and the top plate is referred to as $C_{top}$). The capacitance between interconnects 62 is referred to as $C_{couple}$.

In the interconnect stack, the electrical field distributed among metal wires determines the capacitance value. FIGS. 7A and 7B show a partitioning of the capacitance $C_{bottom}$ and $C_{couple}$ into different regions, respectively. Such a partition helps focus the model derivation on each region. All regions can then be summed to obtain the total capacitance. Furthermore, the impact of BEOL advances, such as the air gap, is mainly on each individual region. Therefore, the partition also improves the flexibility of the modeling efforts.

Based on the partition of the electrical field, the total capacitance is classified into three fundamental cases:

Plate capacitance $C_{plate}$: between two parallel metal surfaces;

Fringe capacitance $C_{fringe}$: from the sidewall of the interconnect to another perpendicular surface, e.g., the ground plate; and Terminal capacitance $C_{terminal}$: from the corner of the interconnect to other metal surfaces.

Each component is separately modeled, as described below.

The capacitance between two parallel plates is well known as equation (17):

$$\frac{C_{plate}}{\varepsilon} = \frac{W}{H} \quad (17)$$

where W is the width of the interconnect,
H is the distance between the plate and the interconnect, and
∈ is the static permittivity of the material, where (∈=∈0*∈r); ∈r being the relative static permittivity and ∈0 being the vacuum permittivity.

The fringe capacitance, $C_{fringe}$, between two perpendicular surfaces can be approximated as a circular region from H to H+T on the ground plate, as seen in FIG. 7C. Thus, the fringe capacitance is integrated from H to H+T along the x direction, as expressed by equation (18)

$$\frac{C_{fringe}}{\varepsilon} = \int \frac{width}{distance} = \int_H^{H+T} \frac{dx}{\frac{\pi}{2}x} = \frac{2}{\pi}\ln\left(1+\frac{T}{H}\right) \quad (18)$$

where T is the thickness of the interconnect,
H is the distance between the plate and the interconnect, and ∈ is the static permittivity of the material, where (∈=∈0*∈r); ∈r being the relative static permittivity and ∈0 being the vacuum permittivity.

The last component is the terminal capacitance $C_{terminal}$. Similar to the field from a point charge, the electrical field originating from the terminal is dispersed toward the plate, but limited to the region as shown in FIGS. 7A and B. The range of such a field is approximated from 0 to H along the x direction, as seen in FIG. 7D. Equation (19) expresses an approximation of the terminal capacitance $C_{terminal}$. Note that the terminal capacitance is independent of the dimensions, similar to the capacitance from a point charge.

$$\frac{C_{terminal}}{\varepsilon} = \int \frac{width}{distance} \approx \int_0^H \frac{dx}{\frac{\pi}{4}(H+x)} = \frac{4}{\pi}\ln 2 \quad (19)$$

∈ is the static permittivity of the material; (∈=∈0*∈r), where ∈r is the relative static permittivity, and ∈0 is the vacuum permittivity.

Explanation will now be provided of models of practical interconnect stack structures. The first example is the capacitance of a single interconnect on top of a plate. This capacitance is sometimes named as the ground capacitance, and is important for global on-chip interconnects. As the electrical fields shown in FIG. 7A illustrate, the total line-to-plate capacitance consists of three main components, i.e., lower-plate, lower terminal and fringe capacitance. They are independent of each other. The total capacitance, $C_{bottom}$, is the summation of these three components, as seen in equation (20):

$$C_{bottom} \approx C_{lower-plate} + 2C_{lower-terminal} + 2C_{fringe} \quad (20)$$

In reality, the electrical field of the three basic components is not exactly as shown in FIG. 7A. Their boundaries are distorted, leading to some slight differences. Nevertheless, decomposing the electrical field into the basic components maintains the essential scalability to wire dimensions. To account for the field distortion, particularly in the terminal capacitance, equation (21) is used to calculate the lower terminal capacitance, $C_{lower-terminal}$:

$$\frac{C_{lower-terminal}}{\varepsilon} = \frac{2}{\pi} \quad (21)$$

where ∈ is the static permittivity of the material; (∈=∈0*∈r), where ∈r is the relative static permittivity, and ∈0 is the vacuum permittivity.

For a single line on top of a plate, the coupling between the upper terminal and the ground plate is also considered. By integrating the field, similar to as with equation (19), the upper terminal capacitance $C_{upper-terminal}$ can be described by equation (22):

$$\frac{C_{upper-terminal}}{\varepsilon} = \frac{1}{\pi} \quad (22)$$

where ∈ is the static permittivity of the material; (∈=∈0*∈r), where ∈r is the relative static permittivity, and ∈0 is the vacuum permittivity.

By combining the upper and lower terminal capacitances with the plate and fringe capacitances (equations (17) and (18)), a physical model for the single interconnect and plate structure is as seen in equation (23):

$$\frac{C_{bottom}}{\varepsilon} = \frac{W}{H} + \frac{4}{\pi}\ln\left(1 + \frac{T}{H}\right) + \frac{6}{\pi} + \frac{2}{\pi}\ln\left[1 + \frac{\pi W}{2(1+\pi)(H+T)}\right] \quad (23)$$

where $\in$ is the static permittivity of the material; ($\in=\in0*\in r$), where $\in r$ is the relative static permittivity, and $\in 0$ is the vacuum permittivity.

Over a wide range of dimensions, the new model matches well with the simulation results. The physical nature of the model guarantees the scalability with all line dimensions.

The role of terminal capacitance is more significant than previously believed. In fact, the parallel plate capacitance between the bottom of the wire to the plate, $C_{lower-plate}$, is actually the smallest component at the nominal dimensions. This is due to the increasing aspect ratio of the metal wire during the scaling. On the other hand, the terminal capacitance, $C_{lower-terminal}$, is the largest component and contributes approximately half of $C_{bottom}$. Therefore, to create an accurate model of the terminal capacitance it is important to calculate the total capacitance in a contemporary interconnect structure. While this term is usually ignored in previous models, the present disclosure physically captures its important role in the calculation.

Equation (21) predicts that the lower terminal capacitance, $C_{lower-terminal}$, remains as a constant during the scaling of the distance H, while the lower plate capacitance, $C_{lower-plate}$, and fringe capacitance, $C_{fringe}$, are inversely proportional to the distance H as shown in equations (17) and (18). Therefore, the total capacitance, $C_{bottom}$, does not rapidly approach zero as the distance H increases. In principle the lower terminal capacitance, $C_{lower-terminal}$, decreases when the distance H is much larger than the distances W and T, because of the distortion of the electrical field. The neglect of such distortion does not introduce a significant amount of model errors. Thus the lower terminal capacitance, $C_{lower-terminal}$, is kept as a constant in equation (21). With the minimum fitting in the newly disclosed model, the distribution of the error is more stable than prior art models across the large range of wire dimensions.

Figure 8:
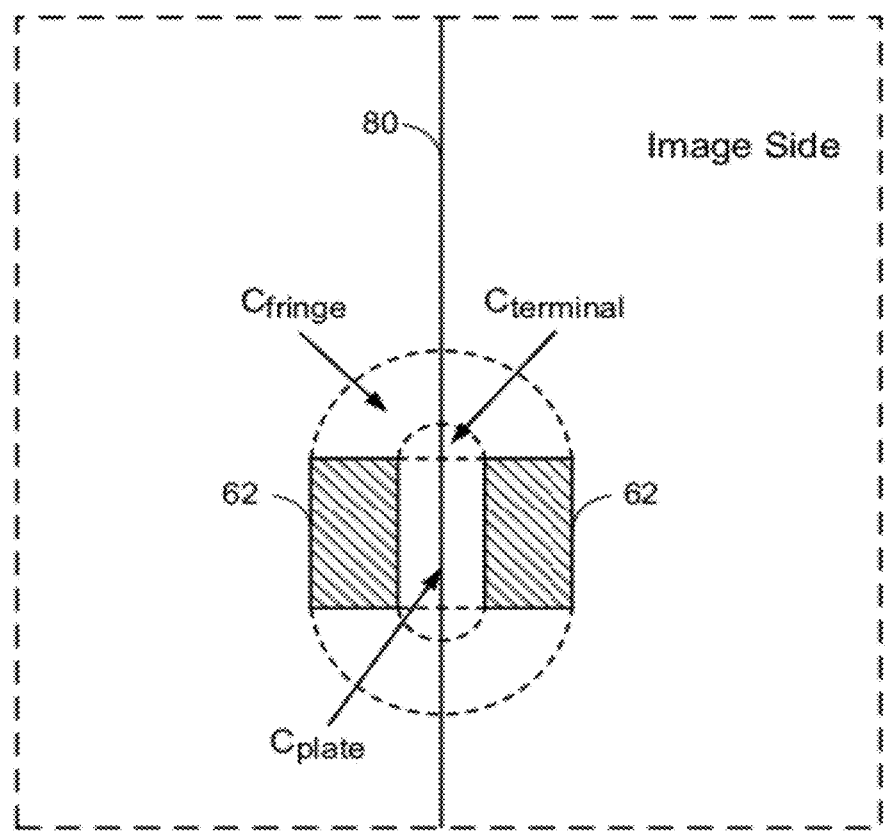
FIG. 8 is a diagram illustrating an exemplary image method of calculating coupling capacitance.

The coupling capacitance between two identical wires, as seen in FIG. 8, will now be described. Based on the model for a single line above one plate, an image method can be applied. That is, a virtual plate 80 is inserted in the middle of the wires 62. Accordingly, the coupling capacitance, $C_{couple}$, is derived as shown in equation (24). It is noted that there are two terminal-to-terminal capacitances between two lines, which are also constants.

$$\frac{C_{couple}}{\varepsilon} = \frac{T}{S} + \frac{2}{\pi}\ln\left(1 + \frac{2W}{S}\right) + \frac{3}{\pi} + \frac{1}{\pi}\ln\left[1 + \frac{\pi T}{2(1+\pi)(S/2+W)}\right] \quad (24)$$

where T is the thickness of the wires,
S is the spacing between wires,
W is the width of the wires, and
$\in$ is the static permittivity of the material, where ($\in=\in_0*\in_r$); $\in_r$ being the relative static permittivity, and $\in_0$ being the vacuum permittivity.

Figure 9A:
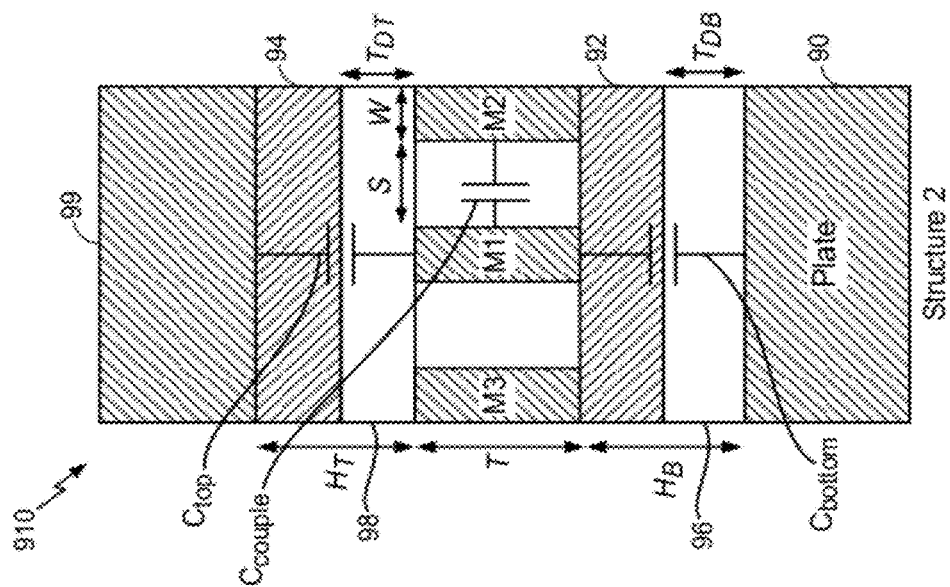
FIGS. 9A and 9B are cross section diagrams showing exemplary interconnect stack structures.
Figure 9B:
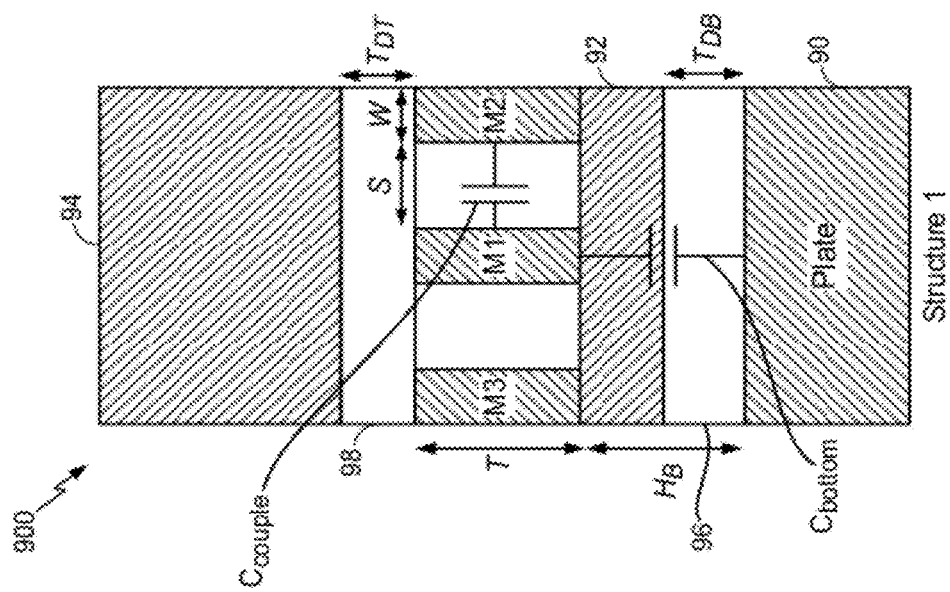

FIGS. 9A and 9B show a contemporary interconnect structure with air gaps and low-κ dielectrics to reduce the capacitance, and the cap layer to prevent copper diffusion. FIG. 9A shows a 2D structure that represents global wires M1, M2, M3 on top of a plate 90. IMD layers 92, 94, as well as barrier layers 96, 98 are also shown. The dimensions: wire thickness (T), spacing (S), wire width (W), distance from wire to bottom plate ($H_B$), bottom cap layer thickness ($T_{DB}$) and top cap layer thickness ($T_{DT}$) are designated, as are the coupling capacitance, $C_{couple}$, and the bottom capacitance, $C_{bottom}$.

FIG. 9B shows inter metal wires between two metal plates. The elements of FIG. 9B are the same as those of FIG. 9A, except, FIG. 9B also shows the top plate 99, and designates the distance from wire to top plate ($H_T$), and the top capacitance, $C_{top}$. As opposed to the simple structures discussed above, in these structures there are multiple electrodes. Therefore, the shielding effect of the electrical field as well as the charge sharing effect among different nodes should be considered.

Initially, the models without the cap layer and the air gap will be discussed. Then, these advanced technology elements will be added into the model.

Figure 10A:
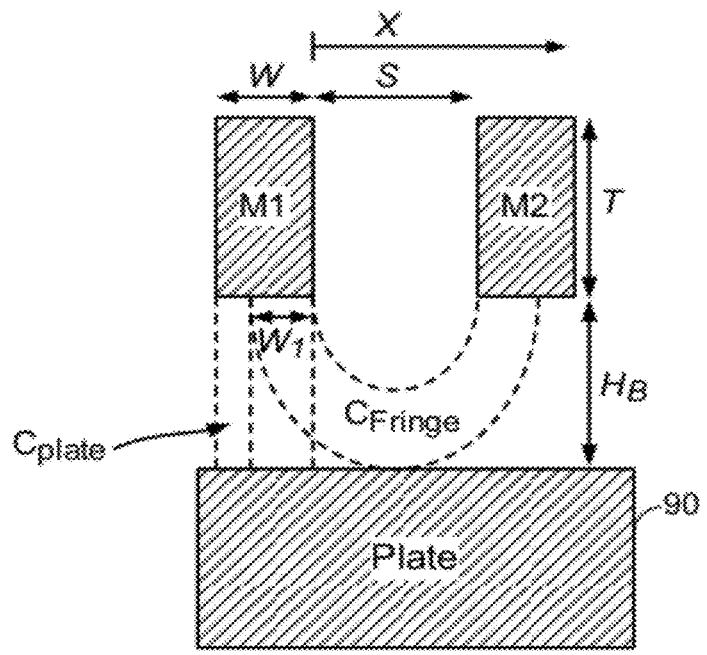
FIGS. 10A and 10B are cross section diagrams showing field shielding and charge sharing effects, respectively.

When there are multiple wires, the field lines may not fully end to a single conductive surface; some of the field lines go to other neighboring wire surfaces. This is the shielding effect when there are multiple coupling neighbors. For instance, FIG. 10A shows that for the fringe capacitance, $C_{fringe}$, component of the coupling capacitance, $C_{couple}$, only part of the electrical field originating from the lower surface of the wire M1, i.e., within region $W_1$, can reach the lower sidewall of the wire M2. The rest of the field is shielded by the metal plate 90 underneath. As a result the fringe capacitance, $C_{fringe}$, no longer increases with the width, W, if the width, W, is larger than $H_B$–S/2. A regional linear function is introduced to handle such a case, as seen in equation (25).

$$f(x, a, b) = \begin{cases} 0 & x < a \\ x - a & a \leq x \leq b \\ b - a & x > b \end{cases} \quad (25)$$

The regional dimensions $W_1$ for the bottom portion, and $W_2$ for the top portion (not shown because a top plate is not depicted in this example) are used instead of W to account for the shielding effect in the calculation of the fringe capacitance, $C_{fringe}$, as seen in equation (26) and (27).

$$W_1 = \begin{cases} f(W, 0, H_B - S/2) & H_B \geq S/2 \\ 0 & H_B < S/2 \end{cases} \quad (26)$$

$$W_2 = \begin{cases} f(W, 0, H_T - S/2) & H_T \geq S/2 \\ 0 & H_T < S/2 \end{cases} \quad (27)$$

Similarly, other regional dimensions to account for the field shielding effect include:

$$T_1 = f\left(T, 0, \sqrt{S^2 + H_B^2} - H_B\right) \quad (28)$$

$$T_2 = f\left(T, 0, \sqrt{S^2 + H_T^2} - H_T\right) \quad (29)$$

$$H_{B1} = f(H_B, 0, S/2) \quad (30)$$

$$H_{T1} = f(H_T, 0, S/2) \quad (31)$$

where $T_1$ and $H_{B1}$ are the dimensions accounting for the shielding of the bottom plate, and $T_2$ and $H_{T1}$ are the dimensions accounting for the shielding of the top plate ($T_2$ not shown because a top plate is not depicted in this example).

Figure 10B:
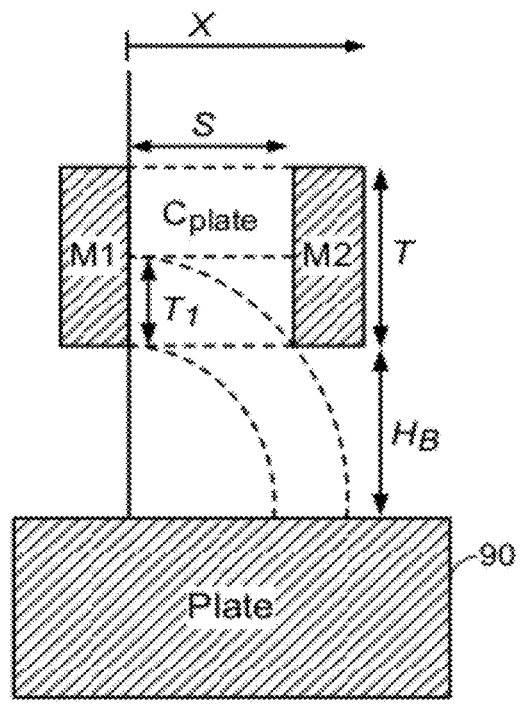

Charge sharing is another important effect in the multiple electrode case. Charge sharing occurs because the field from one conductor may be shared by two or more wire surfaces. An example is shown in FIG. 10B in which the electrical field originating within the region $T_1$ from the right sidewall of the wire M1 can be coupled to both the plate 90 underneath and the wire M2. The total charge within the region $T_1$ is therefore shared between the plate 90 and the wire M2. As a result the plate capacitance, $C_{plate}$, between the wires M1 and M2 will be smaller than the original value of T/S. Equation (32) accounts for the charge sharing effect $$C_1' = C_1 \cdot \frac{C_1}{C_1 + C_2} = \frac{C_1^2}{C_1 + C_2} \tag{32}$$

where C1 and C2 are the capacitances between two electrodes without considering charge sharing, and $C_1'$ and $C_2'$ are the capacitances with charge sharing.

Thus, considering the charge sharing effect, the plate capacitance, $C_{plate}$, in FIG. 10B is calculated as:

$$\frac{C_{plate}}{\varepsilon} = \int_{T_1} \frac{\Delta C_{plate}^2}{\Delta C_{plate} + \Delta C_{fringe}} + \frac{T - T_1}{S} \tag{33}$$

$$= \int_{H_B}^{H_B+T_1} \frac{\left(\frac{dx}{S}\right)^2}{\frac{dx}{S} + \frac{2dx}{\pi x}} + \frac{T - T_1}{S}$$

$$= \frac{T}{S} - \frac{2}{\pi} \ln\left(1 + \frac{T_1}{H_B + 2S/\pi}\right)$$

where $\varepsilon$ is the static permittivity of the material; ($\varepsilon=\varepsilon_0*\varepsilon_r$), where $\varepsilon_r$ is the relative static permittivity, and $\varepsilon_0$ is the vacuum permittivity.

By including both effects of field shielding and charge sharing, the capacitance components in Structure 1 and 2 (FIGS. 9A and B) are derived below. Similar to the coupling capacitance, $C_{couple}$, in the simple case (FIG. 7B), the coupling capacitance, $C_{couple}$, in structures 1 and 2 of FIGS. 9A and B has five major components, namely the upper fringe capacitance, $C_{upper-fringe}$, the upper terminal capacitance, $C_{upper-terminal}$, the plate capacitance, $C_{plate}$, the lower terminal capacitance, $C_{lower-terminal}$, and the lower fringe capacitance $C_{lower-fringe}$.

Table 1 summarizes the formulas.

TABLE 1

COMPACT MODELS OF $C_{couple}$

| Component | Model |
|---|---|
| $\dfrac{C_{plate}}{\varepsilon}$ | $\dfrac{T}{S} - \dfrac{2}{\pi}\ln\left[\left(\dfrac{H_B + 2S/\pi + T_1}{H_B + 2S/\pi}\right)\left(\dfrac{H_T + 2S/\pi + T_2}{H_T + 2S/\pi}\right)\right]$ |
| $\dfrac{C_{lower-terminal}}{\varepsilon}$ | $\dfrac{\left[\dfrac{2}{\pi}\ln(1 + 1.2974 H_{B1}/S)\right]^2}{\dfrac{2}{\pi}\ln(1 + 1.2974 H_{B1}/S) + \dfrac{4}{\pi}\ln(1 + 0.3244 S/H_B)}$ |
| $\dfrac{C_{lower-fringe}}{\varepsilon}$ | $\dfrac{1}{\pi}\ln\left[\dfrac{(S + 2W_1)(S + 2H_B/\pi)}{S(S + 2H_B/\pi + 2W_1)}\right]$ |
| $\dfrac{C_{upper-terminal}}{\varepsilon}$ | $\dfrac{\left[\dfrac{2}{\pi}\ln(1 + 1.2974 H_{T1}/S)\right]^2}{\dfrac{2}{\pi}\ln(1 + 1.2974 H_{T1}/S) + \dfrac{4}{\pi}\ln(1 + 0.3244 S/H_T)}$ |
| $\dfrac{C_{upper-fringe}}{\varepsilon}$ | $\dfrac{1}{\pi}\ln\left[\dfrac{(S + 2W_1)(S + 2H_T/\pi)}{S(S + 2H_T/\pi + 2W_2)}\right]$ | where $\varepsilon$ is the static permittivity of the material; ($\varepsilon=\varepsilon_0*\varepsilon_r$), where $\varepsilon_r$ is the relative static permittivity, and $\varepsilon_0$ is the vacuum permittivity.

Note that structure 1 of FIG. 9A is a special case of structure 2 of FIG. 9B where the distance $H_T$ is infinite. For simplicity, only models for structure 2 of FIG. 9B are presented. The total coupling capacitance, $C_{couple}$, is the sum of all five components as seen in equation (34).

$$C_{couple} = \tag{34}$$
$$C_{plate} + C_{lower-terminal} + C_{upper-terminal} + C_{lower-fringe} + C_{upper-fringe}$$

Figure 11A:
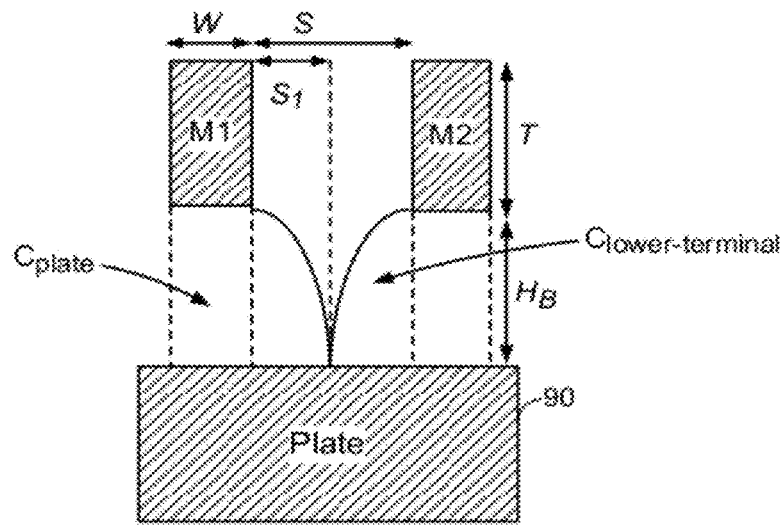
FIGS. 11A and 11B are cross section diagrams showing field shielding effects.
Figure 11B:
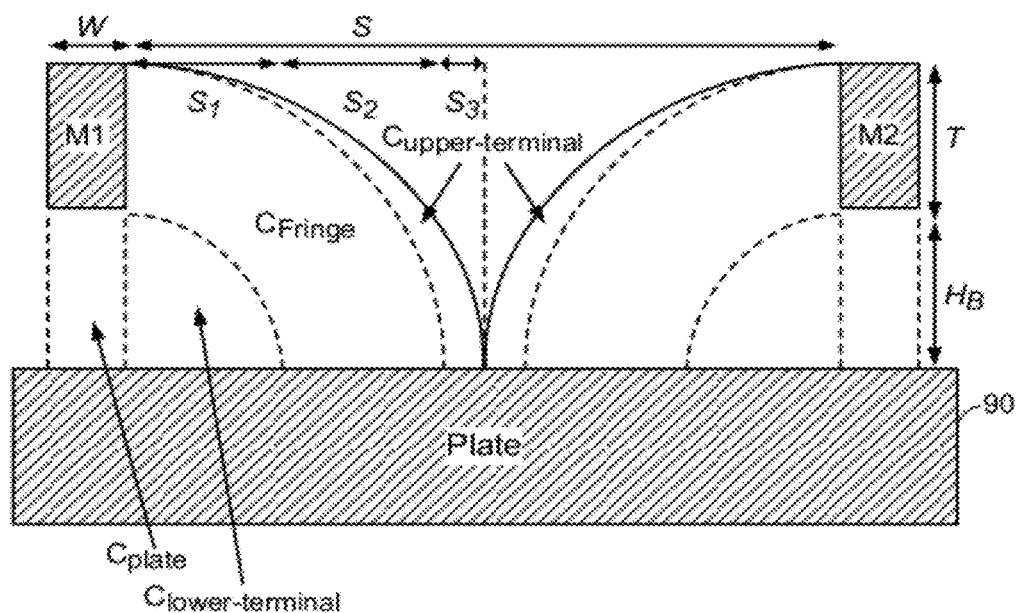

Referring now to FIGS. 11A and 11B, the line-to-plate capacitance $C_{bottom}$ will be discussed. The line-to-plate capacitance, $C_{bottom}$ has four major components: the plate capacitance, $C_{plate}$, the lower terminal capacitance, $C_{lower-terminal}$, the fringe capacitance, $C_{fringe}$ and the upper terminal capacitance, $C_{upper-terminal}$. Among these components, the lower terminal capacitance, $C_{lower-terminal}$, the fringe capacitance, $C_{fringe}$ and the upper terminal capacitance, $C_{upper-terminal}$ are optional, depending on the space S between neighboring lines.

FIG. 11A shows the conditions when these components may not be necessary: when the space, S, is smaller (i.e., $S_1$) than twice the distance between the line and the plate, $H_B$, the line-to-plate capacitance $C_{bottom}$ will only have two components, i.e., plate capacitance $C_{plate}$ and lower terminal capacitance $C_{lower-terminal}$ because the other fields are shielded out. As seen in FIG. 1B, when the space, S, increases, to the space, $S_2$, the line-to-plate capacitance $C_{bottom}$ has another component, i.e., the fringe capacitance $C_{fringe}$. When the space, S is large enough (i.e., $S_3$), the field from the top surface will be able to reach the bottom plate and thus the upper terminal capacitance $C_{upper-terminal}$ appears. To account for such a field shielding effect, three regional dimensions related to the spacing, S, are introduced, as seen in equations (35), (36), and (37):

$$S_1 = f(S/2, 0, H_B) \tag{35}$$

$$S_2 = f(S/2, H_B, H_B + T) \tag{36}$$

$$S_3 = f(S/2, H_B + T, 2H_B + 2T) \tag{37}$$

Note that the capacitance values $C_{lower-terminal}$, $C_{fringe}$ and $C_{upper-terminal}$ can be further divided into right and left capacitances if the spacing, S, at different sides are different.

Figure 12:
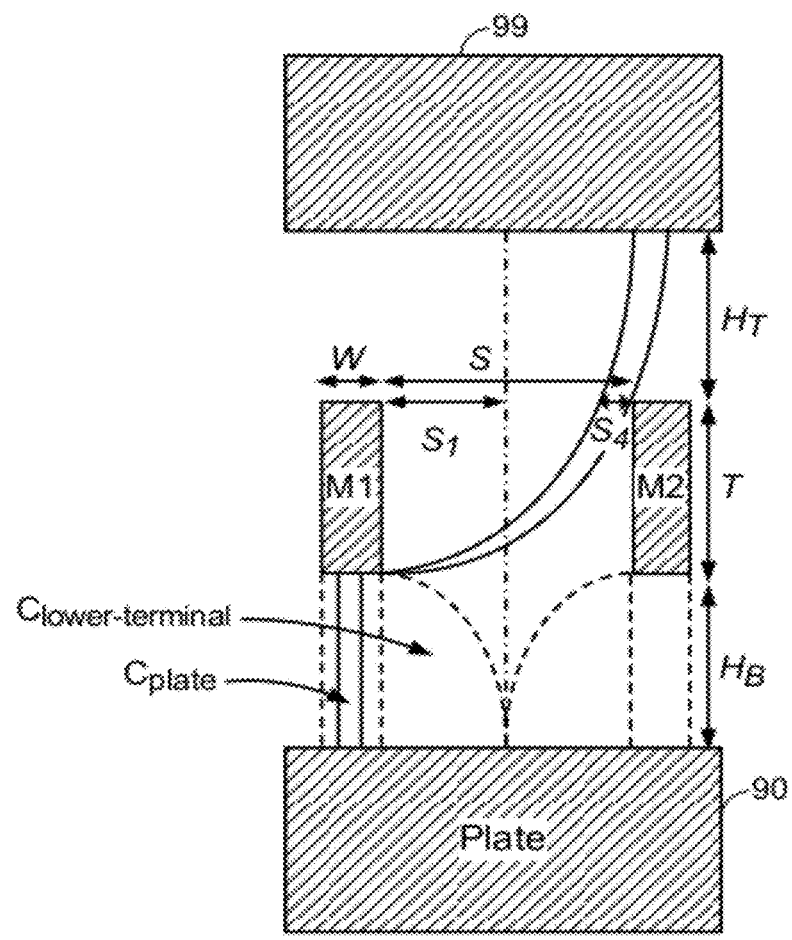
FIG. 12 is a cross section diagram showing a charge sharing effect involving top and bottom plates.

Referring now to FIG. 12, the effects of charge sharing will be further explained. When a top plate 99 and bottom plate 90 exist, and the space, S, is larger than $(T^2+2TH_T)^{1/2}$, the electrical field from the lower terminal is shared between the lower and the upper plates, as shown in FIG. 12. This charge sharing effect reduces the lower terminal capacitance, $C_{lower-terminal}$. Thus, another regional dimension is introduced, as seen in equation (38):

$$S_4 = f(S, \sqrt{T^2 + 2TH_T}, 2H_B + 2T) \quad (38)$$

Table 2 summarizes the models of the line-to-plate capacitance $C_{bottom}$.

TABLE 2

Compact Models of $C_{Bottom}$

| Component | Model |
|---|---|
| $\dfrac{C_{lower-plate}}{\varepsilon}$ | $\dfrac{W}{H_B}$ |
| $\dfrac{C_{lower-terminal}}{\varepsilon}$ | $\dfrac{\left[\dfrac{4}{\pi}\ln\left(1 + \dfrac{0.76 S_1}{H_B}\right)\right]^2}{\dfrac{4}{\pi}\ln\left[\left(1 + \dfrac{0.76 S_1}{H_B}\right)\left(1 + \dfrac{S_4/4}{H_T + T}\right)\right]}$ |
| $\dfrac{C_{fringe}}{\varepsilon}$ | $\dfrac{2}{\pi}\ln\left[\left(\dfrac{H_B + S_2}{H_B}\right)\left(\dfrac{S + H_B}{S + H_B + S_2}\right)\right]$ |
| $\dfrac{C_{upper-terminal}}{\varepsilon}$ | $\dfrac{4}{\pi}\ln\left(1 + \dfrac{S_3/4}{H_B + T}\right)$ | where $\varepsilon$ is the static permittivity of the material; ($\varepsilon = \varepsilon 0 * \varepsilon r$), where $\varepsilon r$ is the relative static permittivity, and $\varepsilon 0$ is the vacuum permittivity.

The line-to-plate capacitance is the sum of all four components in Structure 1 and the plate capacitance, $C_{plate}$, lower terminal capacitance $C_{lower-terminal}$, and fringe capacitance, $C_{fringe}$, in Structure 2, as seen in equation (39).

$$C_{bottom} = C_{plate} + 2C_{lower-terminal} + 2C_{lower-fringe} + 2C_{upper-terminal} \quad (39)$$

To calculate the line-to-plate capacitance, $C_{top}$, $H_B$ is substituted with $H_T$ in equations (35)-(38) and Table 2. The total capacitance of line M1 is $2C_{couple} + C_{bottom}$ in Structure 1, and $2C_{couple} + C_{bottom} + C_{top}$ in Structure 2.

In today's interconnect technology, the impact of the cap layer on the capacitance becomes more pronounced because its thickness scales much more slowly than inter layer dielectric or inter metal dielectric thickness. In one embodiment, the cap layer capacitance is incorporated into the appropriate component. For the line-to-plate capacitance, $C_{bottom}$ or $C_{top}$, in Table 2, this is achieved by replacing the values $H_B$ or $H_T$ with the values $H_B'$ or $H_T'$ based upon equations (40) and (41).

$$H_B' = H_B + \left(\dfrac{\varepsilon}{\varepsilon_D} - 1\right) T_{DB} \quad (40)$$

$$H_T' = H_T + \left(\dfrac{\varepsilon}{\varepsilon_D} - 1\right) T_{DT} \quad (41)$$

where $\varepsilon$ is the static permittivity of the material, and $\varepsilon_D$ is the static permittivity of the damage layer.

For the coupling capacitance, it is not sufficient to only replace the values $H_B$ or $H_T$ with the values $H_B'$ or $H_T'$ because the electrical field is not uniformly partitioned among different layers. For instance, if the top cap layer thickness, $T_{DT}$, is larger than the distance $S/2$, the upper terminal capacitance, $C_{upper-terminal}$, is only in the top cap layer. However, if the top cap layer thickness, $T_{DT}$, is smaller than the distance $S/2$, part of the lower terminal capacitance, $C_{lower-terminal}$, is in the low-κ dielectric layer. Therefore models of the coupling capacitance, $C_{couple}$, are regional. The regional function, F, is listed in Table 3.

TABLE 3

$C_{couple}$ Model Parameters with Cap Layer

| Component | Region | F | Dimension |
|---|---|---|---|
| $\dfrac{C_{plate}}{\varepsilon}$ | Entire | 1 | $H_B \to H_B'$<br>$H_T \to H_T'$ |
| $\dfrac{C_{lower-terminal}}{\varepsilon}$ | $H_B - T_{DB} \geq S/2$ | 1 | $H_B \to H_B'$ |
|  | $H_B - T_{DB} < S/2$ | $\dfrac{\varepsilon_D}{\varepsilon}\left[1 + \dfrac{(\varepsilon/\varepsilon_D - 1)(H_B - T_{DB})}{S/2}\right]$ |  |
| $\dfrac{C_{lower-fringe}}{\varepsilon}$ | $H_B - T_{DB} \geq S/2 + W_1$ | 1 |  |
|  | $H_B - T_{DB} < S/2 + W_1$ | $\dfrac{\varepsilon_D}{\varepsilon}\left[1 + \dfrac{(\varepsilon/\varepsilon_D - 1)(H_B - T_{DB})}{S/2 + W_1}\right]$ |  |
| $\dfrac{C_{upper-terminal}}{\varepsilon}$ | $T_{DT} \geq S/2$ | $\dfrac{\varepsilon_D}{\varepsilon}$ | $H_T \to \varepsilon_D H_T'/\varepsilon$ |
|  | $T_{DT} < S/2$ | $1 + \dfrac{(\varepsilon_D/\varepsilon - 1)T_{DT}}{S/2}$ |  |
| $\dfrac{C_{upper-fringe}}{\varepsilon}$ | $T_{DT} \geq S/2 + W_2$ | $\dfrac{\varepsilon_D}{\varepsilon}$ | $H_T \to \varepsilon_D H_T'/\varepsilon$ |

TABLE 3-continued $C_{couple}$ Model Parameters with Cap Layer

| Component | Region | F | Dimension |
|---|---|---|---|
| | $T_{DT} < S/2 + W_2$ | $1 + \dfrac{(\varepsilon_D/\varepsilon - 1)T_{DT}}{S/2 + W_2}$ | | where $\in$ is the static permittivity of the material; ($\in=\in0^*\in r$), where or is the relative static permittivity, and $\in0$ is the vacuum permittivity; and.

$\in_D$ is the static permittivity of the damage layer.

The regional function F approximates the linear combination of the field distribution in non-uniform dielectrics. In the presence of the barrier layer, the capacitance component needs to be corrected by the regional function F and the dimension expressed in equation (42):

$$C_{component} \rightarrow F \cdot C_{component} \quad (42)$$

where Ccomponent is the particular capacitance component being evaluated.

For instance, if the dimension, $T_{DT}$, is larger than the distance S/2, the upper terminal capacitance, $C_{upper-terminal}$ is:

$$\frac{C_{upper-terminal}}{\varepsilon} = \frac{\varepsilon_D}{\varepsilon} \frac{\left[\frac{2}{\pi}\ln(1 + 1.2974 H_{T1}/S)\right]^2}{\frac{2}{\pi}\ln(1 + 1.2974 H_{T1}/S) + \frac{4}{\pi}\ln(1 + 0.3244 S/H_T')} \quad (43)$$

where $\in$ is the static permittivity of the material; ($\in=\in0^*\in r$), where $\in r$ is the relative static permittivity, and $\in0$ is the vacuum permittivity, and $\in_D$ is the static permittivity of the damage layer.

The adoption of the air gap successfully reduces the coupling capacitance between coplanar wires. By changing the effective dimension T/S in the model of the plate and coupling capacitances, $C_{plate}$, $C_{couple}$ the air gap is addressed. Equation (44) shows the updated dimension T/S. Equation (45) is the plate capacitance $C_{plate}$ model.

$$\frac{T}{S} \rightarrow \frac{\varepsilon_0}{\varepsilon}\frac{T}{S} \quad (44)$$

$$\frac{C_{plate}}{\varepsilon} = \frac{\varepsilon_0}{\varepsilon}\frac{T}{S} - \frac{2}{\pi}\left[1 + \frac{\varepsilon_0(1-\varepsilon/\varepsilon)T_1}{\varepsilon(T_1 + H_B')}\right]\ln\left(\frac{H_B + 2S/\pi + T_1}{H_B + 2S/\pi}\right) - \frac{2}{\pi}\left[1 + \frac{\varepsilon_0(1-\varepsilon/\varepsilon_0)T_2}{\varepsilon(T_2 + H_T')}\right]\ln\left(\frac{H_T + 2S/\pi + T_2}{H_T + 2S/\pi}\right) \quad (45)$$

where $\in$ is the static permittivity of the material; ($\in=\in0^*\in r$), where $\in r$ is the relative static permittivity, and $\in0$ is the vacuum permittivity.

Similar to the treatment in the case of the cap layer, to wire to plate capacitance $C_{bottom}$ or $C_{top}$ with the air gap is calculated by replacing the dimensions and multiplying the F term in Table 4.

TABLE 4

$C_{Bottom}$ Model Parameters with the Air Gap

| Component | F | Dimensions |
|---|---|---|
| $\dfrac{C_{lower-plate}}{\varepsilon}$ | 1 | $H_B \rightarrow H_B'$ |
| $\dfrac{C_{lower-terminal}}{\varepsilon}$ | Eq. (46) | $H_B \rightarrow H_B'$ <br> $H_T \rightarrow H_T'$ |
| $\dfrac{C_{fringe}}{\varepsilon}$ | $1 + \dfrac{\varepsilon_0(1 - \varepsilon/\varepsilon_0)T}{\varepsilon(T + H_B')}$ | $H_B \rightarrow H_B'$ |
| $\dfrac{C_{upper-terminal}}{\varepsilon}$ <br> (Structure 1 only) | $1 + \dfrac{\varepsilon_0(1 - \varepsilon/\varepsilon_0)T}{\varepsilon(T + H_B')}$ | $H_B \rightarrow H_B'$ | where $\in$ is the static permittivity of the material; ($\in=\in0^*\in r$), where $\in r$ is the relative static permittivity, and $\in0$ is the vacuum permittivity.

To better model $C_{lower-terminal}$, a fitting parameter $\beta$ is introduced, as seen in equation (46). In one embodiment, the value of $\beta$ is −0.2.

$$\frac{C_{lower-terminal}}{\varepsilon} = \frac{\left[\exp\left(\frac{\beta S_1}{H_B'}\right)\frac{4}{\pi}\ln\left(1 + \frac{0.76 S_1}{H_B'}\right)\right]^2}{\exp\left(\frac{\beta S_1}{H_B'}\right)\frac{4}{\pi}\ln\left(1 + \frac{0.76 S_1}{H_B'}\right) + \frac{4}{\pi}\ln\left(1 + \frac{S_4/4}{H_T' + T\varepsilon/\varepsilon_0}\right)} \quad (46)$$

where $\in$ is the static permittivity of the material; ($\in=\in0^*\in r$), where $\in r$ is the relative static permittivity, and $\in0$ is the vacuum permittivity.

This embodiment presents a new physical model for BEOL interconnect capacitance. Different from previous empirical approaches, the new model is derived from an in-depth analysis of the electrical field distribution between multiple electrodes. The terminal capacitance is identified as an important component in the capacitance modeling. The new model is conveniently customized to incorporate advanced CMOS interconnect structures, such as a cap layer and the air gap.

The model can calculate one or more data points of performance values. In particular embodiments, the data points may be visually presented, such as with plots, tables, matrices, charts, or other types of visually presented processed data. The data points can present trends in design and performance for experimental interconnects in technology nodes projected for development. Although the model is derived from existing wafer data, delays in modeling proposed interconnect designs or interconnect technology is eliminated.

As a result of applying the model, estimates in propagation delay of experimental interconnect design choices can be provided, even in advanced technology nodes. In other words, it can be seen how variations in sizing and material composition affect interconnect behavior. In some instances, the results may include alternative designs with proposed physical dimensions to produce a specific performance, such as to lower power consumption or lower propagation delay. Of course, there may be alternative ways to display the results. The model may also update the results substantially concurrently with the receipt of new input data, such as physical dimensions, to provide a timely response without the need to generate a new model when new input data is available. This reduces the amount of time needed to run on-chip interconnect simulations early in the development cycle of integrated circuits.

The model provides a quick estimation of interconnect behavior beyond existing nodes and provide an accurate picture of the effects on performance by shrinking devices. The model accounts for variations in width, which greatly increase the resistance in shrinking devices. Although the model is derived from existing wafer data, thereafter the model simulates interconnects without using existing wafer data therefore not delaying the development cycle. The model, as configured, can be used by multiple foundries manufacturing interconnects with similar materials to explore their best suited options. In addition, the model can provide users with information on manufacturing optimized interconnects.

Figure 13:
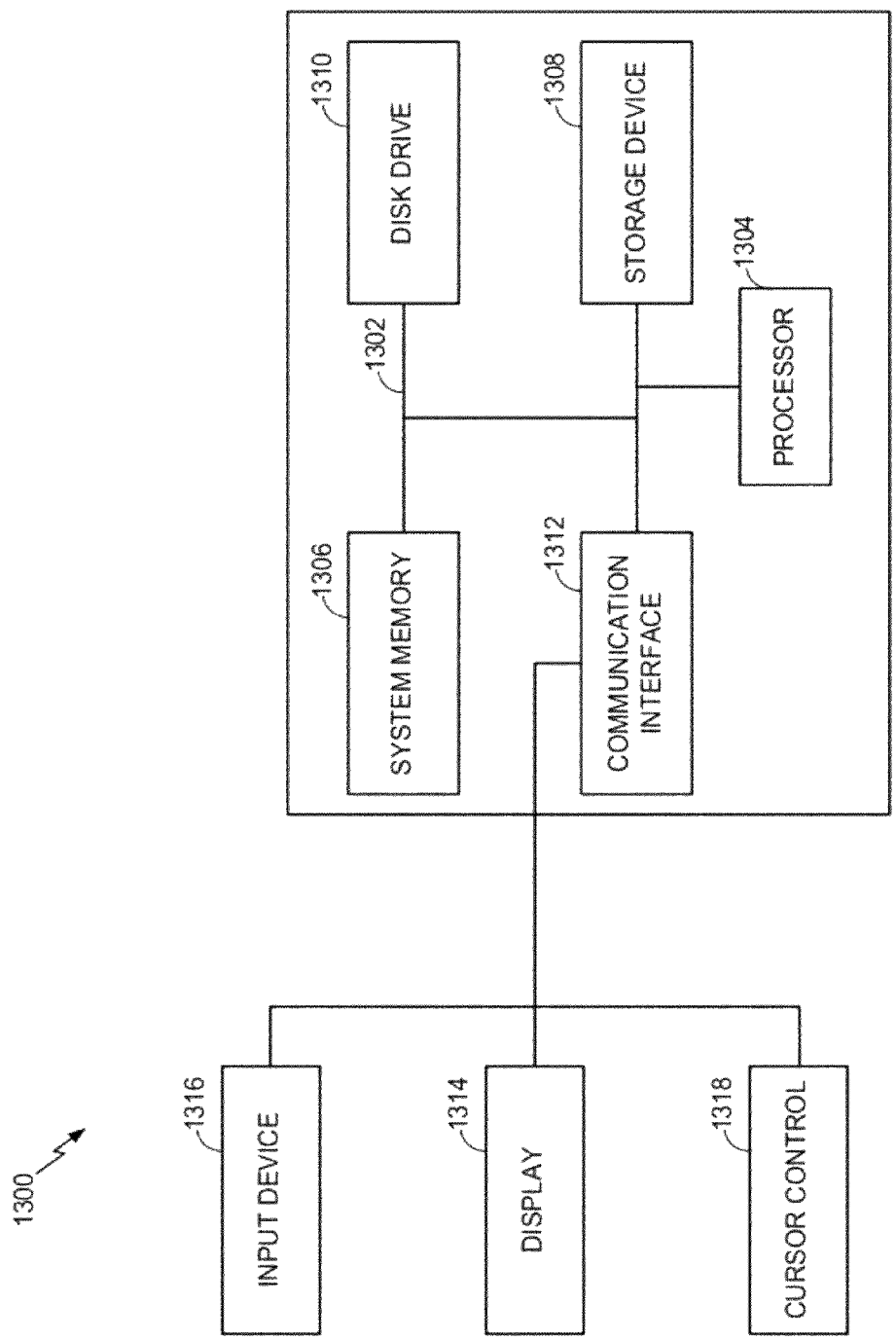
FIG. 13 is a block diagram illustrating an exemplary computer system suitable for predicting interconnect behavior relative to technology scaling.

FIG. 13 is a diagram illustrating an exemplary computer system suitable for predicting interconnect behavior relative to technology scaling. The computer system 1300 may be used to implement computer programs, applications, methods, processes, or other software to perform the above-described techniques. The computer system 1300 includes a bus 1302 or other communication mechanism for communicating information, which interconnects subsystems and devices, such as a processor 1304, a system memory 1306 (e.g., RAM), a storage device 1308 (e.g., ROM), a disk drive 1310 (e.g., magnetic or optical), a communication interface 1312 (e.g., modem or Ethernet card), a display 1314 (e.g., CRT or LCD), an input device 1316 (e.g., keyboard), and a cursor control 1318 (e.g., mouse or trackball).

The computer system 1300 performs specific operations by the processor 1304 executing one or more sequences of one or more instructions stored in the system memory 1306. Such instructions may be read into the system memory 1306 from another computer readable medium, such as the static storage device 1308 or the disk drive 1310. In some examples, hard-conductive traced circuitry may be used in place of or in combination with software instructions for implementation.

Moreover, execution of the sequences of instructions may be performed by a single computer system 1300. According to some examples, two or more computer systems 1300 coupled by a communication link (e.g., LAN, public switched telephone network, or conductive traceless network) may perform the sequence of instructions in coordination with one another. The computer system 1300 may transmit and receive messages, data, and instructions, including program, i.e., application code, through the communication link and the communication interface 1312. The processor 1304 may execute received program code, stored program code as in a disk drive 1310, or other non-volatile storage for later execution.

As will be appreciated by one skilled in the art, the present disclosure may be embodied as a system, method or computer program product. Accordingly, the present disclosure may take the form of an entirely hardware embodiment, an entirely software embodiment (including firmware, resident software, micro-code, etc.) or an embodiment combining software and hardware aspects that may all generally be referred to as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The term "computer readable medium" refers to any medium that participates in providing instructions to the processor for execution. The computer-usable or computer-readable medium may be, for example but is not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more conductive traces, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured by optical scanning the paper or other medium, then compiled, interpreted, or otherwise processed in a suitable manner, if necessary, and then stored in a computer memory.

Computer program code for carrying out operations of the present disclosure may be written in any combination of one or more programming languages, include an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to a external computer (for example, through the Internet using an Internet Service Provider). Although the foregoing examples have been described in some detail for purposes of clarity of understanding, the disclosure is not limited to the details provided. There are many alternative ways of implementing the disclosure. The disclosed examples are illustrative and not restrictive.

Although the present disclosure and its advantages have been described in detail, it should be understood that various changes, substitutions and alterations could be made herein without departing from the spirit and scope of the disclosure as defined by the appended claims. For example, although the preceding description refers to dual damascene processes, other metallization processes are also considered to be within the scope of the present invention. Moreover, the scope of the present application is not intended to be limited to the particular embodiments of the process, machine, manufacture, composition of matter, means, methods and steps described in the specification. Any element in a claim that does not explicitly state "means for" performing a specified function, or "step for" performing a specified function, is not to be interpreted as a "means" or "step" clause as specified in 35 U.S.C. §112, ¶ 6. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such alternative environment and later developed processes, machines, manufacture, compositions of matter, means, methods, or steps.

What is claimed is:

1. A computer program product for estimating performance of an interconnect structure of a semiconductor integrated circuit (IC), the computer program product being tangibly stored on a computer-readable medium, comprising:
   code executing on a computer to dynamically calculate electrical characteristics of the interconnect structure based on input data specific to multiple layers of the interconnect structure, the electrical characteristics of the interconnect structure comprising:
   an upper terminal capacitance component, a lower terminal capacitance component, a fringe capacitance component and a plate capacitance component, each capacitance component being between an interconnect element of the interconnect structure and a conductive plate of the interconnect structure;
   a charge sharing component associated with at least one other interconnect element of a same layer of an interconnect stack; and
   a field shielding component from the at least one other interconnect element of the same layer of the interconnect stack.

2. The medium of claim 1, in which the at least one electrical characteristic of the interconnect structure comprises resistance.

3. The medium of claim 2, in which the input data comprises trace geometry data, trace electrical data, barrier conductive layer geometry data, and barrier conductive layer electrical data.

4. The medium of claim 2, in which the calculation accounts for an electron scatter effect.

5. The medium of claim 1, in which the input data is based upon a plurality of traces, a plurality of cap layers, at least one damage layer, at least one plate, and at least one dielectric layer.

6. The medium of claim 1, in which the at least one electrical characteristic of the interconnect structure comprises a fringe capacitance component accounting for different dielectric constants of at least two of the-layers and a coupling capacitance component accounting for different dielectric constants of at least two of the layers.

7. The medium of claim 6, in which the capacitance of the terminal capacitance component, the fringe capacitance component and the coupling capacitance component are based upon regional dimensions.

8. The medium of claim 1, in which the calculating accounts for air gaps.

9. The medium of claim 1, in which the at least one electrical characteristic comprises inductance.

10. The medium of claim 1, further comprising code executing on a computer to estimate power consumption of an experimental interconnect design based upon the calculated at least one electrical characteristic, the calculated at least one electrical characteristic comprising capacitance and resistance.

11. A system for estimating performance of an interconnect structure of a semiconductor integrated circuit (IC), comprising:
   means for dynamically calculating electrical characteristics of the interconnect structure based on input data specific to multiple layers of the interconnect structure, the electrical characteristics of the interconnect structure comprising:
   an upper terminal capacitance component, a lower terminal capacitance component, a fringe capacitance component and a plate capacitance component, each capacitance component being between an interconnect element of the interconnect structure and a conductive plate of the interconnect structure;
   a charge sharing component associated with at least one other interconnect element of a same layer of an interconnect stack; and
   a field shielding component from the at least one other interconnect element of the same layer of the interconnect stack.

12. The system of claim 11, in which the at least one electrical characteristic of the interconnect structure comprises resistance, and the input data comprises trace geometry data, trace electrical data, barrier conductive layer geometry data, and barrier conductive layer electrical data.

13. The system of claim 11, in which the input data is based upon a plurality of traces, a plurality of cap layers, at least one damage layer, at least one plate, and at least one dielectric layer.

14. A method for dynamically calculating electrical characteristics of an interconnect structure based on input data specific to multiple layers of the interconnect structure, the method comprising:
   dynamically calculating, using a computer, an upper terminal capacitance component, a lower terminal capacitance component, a fringe capacitance component and a plate capacitance component, each capacitance component being between an interconnect element of the interconnect structure and a conductive plate of the interconnect structure;
   dynamically calculating, using a computer, a charge sharing component associated with at least one other interconnect element of a same layer of an interconnect stack; and
   dynamically calculating, using a computer, a field shielding component from the at least one other interconnect element of the same layer of the interconnect stack.

15. The method of claim 14 further comprising dynamically calculating a resistance of the interconnect structure.

16. The method of claim 14 further comprising dynamically calculating the electrical characteristics to account for an electron scatter effect.

17. The method of claim 14 further comprising dynamically calculating a fringe capacitance component accounting for different dielectric constants of at least two of the layers and dynamically calculating a coupling capacitance component accounting for different dielectric constants of at least two of the layers.

18. The method of claim 14 further comprising dynamically calculating the electrical characteristics to account for air gaps.

19. The method of claim 14 further comprising dynamically calculating an inductance of the interconnect structure.

20. The method of claim 14 further comprising dynamically calculating an inductance and a resistance of the interconnect structure to estimate power consumption of an experimental interconnect design.

* * * * *